US010833801B2

(12) United States Patent
Rekaya-Ben Othman et al.

(10) Patent No.: US 10,833,801 B2
(45) Date of Patent: Nov. 10, 2020

(54) SPACE-TIME CODING FOR COMMUNICATION SYSTEMS

(71) Applicant: INSTITUT MINES-TELECOM, Paris (FR)

(72) Inventors: Ghaya Rekaya-Ben Othman, Antony (FR); Asma Mejri, Antibes (FR); Mohamed-Achraf Khsiba, Paris (FR)

(73) Assignee: INSTITUT MINES-TELECOM, Paris (FR)

( * ) Notice: Subject to any disclaimer, the term of this patent is extended or adjusted under 35 U.S.C. 154(b) by 0 days.

(21) Appl. No.: 15/568,177

(22) PCT Filed: Apr. 27, 2016

(86) PCT No.: PCT/EP2016/059366
§ 371 (c)(1),
(2) Date: Oct. 20, 2017

(87) PCT Pub. No.: WO2016/174066
PCT Pub. Date: Nov. 3, 2016

(65) Prior Publication Data
US 2018/0083732 A1    Mar. 22, 2018

(30) Foreign Application Priority Data

Apr. 30, 2015    (EP) .................................... 15305677

(51) Int. Cl.
*H04L 1/00*          (2006.01)
*H04L 1/06*          (2006.01)
(Continued)

(52) U.S. Cl.
CPC ........ *H04L 1/0041* (2013.01); *H03M 13/616* (2013.01); *H04B 7/046* (2013.01);
(Continued)

(58) Field of Classification Search
CPC ... H04L 1/0041; H04L 1/0058; H04L 1/0625; H04L 1/0643; H04L 1/0668;
(Continued)

(56) References Cited

U.S. PATENT DOCUMENTS

2006/0018403 A1*   1/2006   Wang ...................... H04J 13/10
                                                   375/299
2007/0041463 A1*   2/2007   Wang ....................... H04B 7/04
                                                   375/267
(Continued)

OTHER PUBLICATIONS

International Search Report and Written Opinion for PCT/EP2016/059366, dated Jul. 22, 2016.
(Continued)

*Primary Examiner* — David B Lugo
(74) *Attorney, Agent, or Firm* — Meagher Emanuel Laks Goldberg & Liao, LLP

(57) ABSTRACT

There is provided a method of generating a space-time block code (STBC) for encoding a digital data sequence comprising a set of independent symbols to be transmitted through a transmission channel in a communication system, the space-time block code being represented by a set of linear dispersion matrices in a linear dispersion representation, each linear dispersion matrix comprising components having complex values, the method comprising, generating at least some of the linear dispersion matrices depending on component-wise conditions related to a set of selected pairs of the linear dispersion matrices, each pair comprising a first linear dispersion matrix and a second linear dispersion matrix, said component-wise conditions comprising a component-wise condition between the components of the first linear dispersion matrix and the components of the second linear dispersion matrix.

20 Claims, 8 Drawing Sheets

(51) Int. Cl.
*H03M 13/00* (2006.01)
*H04B 7/0456* (2017.01)
*H04B 7/06* (2006.01)
*H04B 7/08* (2006.01)

(52) U.S. Cl.
CPC ......... *H04B 7/0615* (2013.01); *H04B 7/0842* (2013.01); *H04L 1/0058* (2013.01); *H04L 1/0625* (2013.01); *H04L 1/0643* (2013.01); *H04L 1/0668* (2013.01)

(58) Field of Classification Search
CPC .... H04B 7/046; H04B 7/0615; H04B 7/0842; H03M 13/616

See application file for complete search history.

(56) References Cited

U.S. PATENT DOCUMENTS

| | | | |
|---|---|---|---|
| 2007/0177688 A1* | 8/2007 | Wu | H04B 7/0417 375/267 |
| 2009/0202015 A1* | 8/2009 | Kwon | H04L 1/0643 375/267 |
| 2010/0040165 A1* | 2/2010 | Jiang | H04L 1/0643 375/267 |

OTHER PUBLICATIONS

Vehkalahti R et al: "Fast-Decodable Asyrrmetric Space-Time Codes From Division Algebras", IEEE Transactions on Information Theory, IEEE Press, USA, vol. 58, No. 4, Apr. 1, 2012 (Apr. 1, 2012), pp. 2362-2385.

Pavan Srinath Ketal: "Generalized Silver Codes", IEEE Transactions on Information Theory, IEEE Press, USA, vol. 57, No. 9, Sep. 1, 2011 (Sep. 1, 2011) pp. 6134-6147.

* cited by examiner

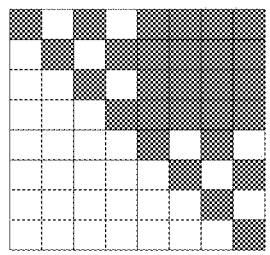
FIGURE 10
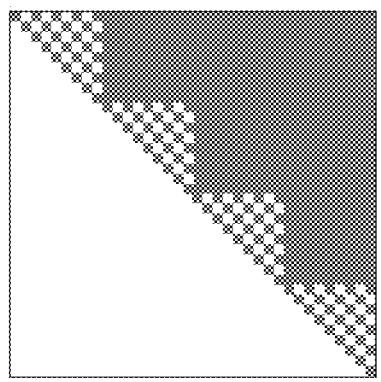
FIGURE 11
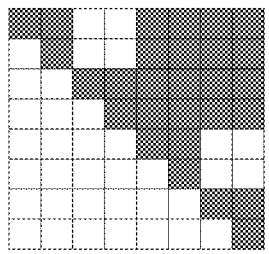     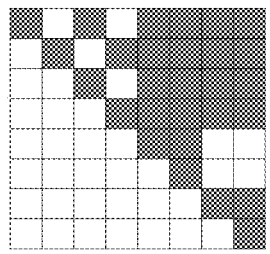     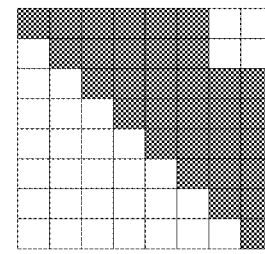
FIGURE 12        FIGURE 13        FIGURE 14

SPACE-TIME CODING FOR COMMUNICATION SYSTEMS

BACKGROUND

The invention generally relates to digital communication and in particular to methods, systems, and computer program products for generating linear Space-Time Block Codes (STBC).

Driven by the developments of digital technologies and the emergence of new multimedia applications, different wireless communication systems have been developed, such as the cellular and wireless ad-hoc networks accommodating single or multiple transmitters/receivers using single or multiple antennas.

In Wireless communication systems, the transmission of a digital stream, through a physical channel may be disturbed by undesirable channel effects, such as multipath reflection and propagation fading, leading to signal distortion. Diversity schemes are conventionally used to address such fading effects while improving the system performance. In particular, transmit diversity increases the likelihood that a receiving station may receive the data transmitted by a transmitting station.

Wireless communication systems can implement the diversity by using various schemes, such as a space time coding (STC) scheme to maximize the diversity gain and thus increase the transmission reliability. Unlike uncoded schemes (i.e. without STC) which provide only a receive diversity, for coded schemes using STC, a transmit diversity brought by the time dimension is additionally offered. In the Space Time Coding scheme, spatial diversity gain can be obtained by using multiple transmit antennas in a fading channel environment.

A known Space Time Coding scheme includes the space time block codes (STBC) scheme. Space-time block coding consists in transmitting multiple copies of the same data through multiple antennas in order to improve the reliability of the data-transfer through the noisy channel.

A conventional transmitter using a space-time block code (STBC) comprises a serial-to-parallel converter to create a block of symbols and provides the created symbol block to an encoder. The encoder creates a number of combinations with the symbols, and delivers the combinations via the $n_t$ transmission antennas.

Symbols output from the encoder can be expressed by a $n_t$*T encoding matrix, with T representing the temporal code length. Symbols in each row of the encoding matrix are transmitted for respective time periods, and symbols in each column are transmitted via the respective antennas.

It is desirable that the columns of the encoding matrix be orthogonal with one another to facilitate the decoding and provide maximum diversity gain.

The choice of the decoder impacts the diversity order obtained after decoding. Further, in a practical multiple-input multiple-output (MIMO) system, the complexity of the maximum-likelihood (ML) decoding at the receiver is a major concern. Indeed, as space-time codes are represented by matrices, the size of a codebook can be quite large and the maximum-likelihood (ML) decoding may have a significant complexity.

The construction of linear STBCs offering a low-complexity ML decoding using the well known Sphere Decoder (SD) has been extensively studied in the past years. A first considered approach is based on the Hurwitz-Radon (HR) Theory for mutual orthogonality between the weight matrices defining the linear code. Examples of STBCs codes using such orthogonal design comprise the Alamouti STBC codes (Alamouti in "A Simple Transmit Diversity Technique for Wireless Communications," IEEE Journal on Selected Areas in Communications, vol. 16, pp. 1451-1458 (October 1998)). Such orthogonal codes achieve full diversity and have fast ML decoding at the receiver. However, it is difficult to construct orthogonal designs with rate higher than one for more than four transmit antennas. To overcome this problem, STBCs from quasi-orthogonal designs, for which the orthogonality is relaxed to improve symbol rates, have been proposed. The decoding complexity is hence increased to improve symbol rates. However, these codes do not achieve the full diversity and suffer from bad performance at high SNR.

There is accordingly a need for methods and systems of generating STBCs satisfying a desired diversity order and/or a desired coding rate, while offering a reduced complexity.

SUMMARY

In order to address these and other problems, there is provided a method of generating a space-time block code (STBC) for encoding a digital data sequence comprising a set of independent symbols to be transmitted through a transmission channel in a communication system, the space-time block code being represented by a set of linear dispersion matrices in a linear dispersion representation, each linear dispersion matrix comprising components having complex values. The method comprises, generating at least some of the linear dispersion matrices depending on component-wise conditions related to a set of selected pairs of the linear dispersion matrices, each pair comprising a first linear dispersion matrix and a second linear dispersion matrix, the component-wise conditions comprising a component-wise condition between the components of the first linear dispersion matrix and the components of the second linear dispersion matrix.

In one embodiment, the component-wise condition may depend, for each column of the linear dispersion matrices, on at least one of the real dimensions of the product between a component of the first linear dispersion matrix and the complex conjugate of a component of the second linear dispersion matrix, the component-wise condition being satisfied if the at least one real dimension of the product is null, for each column of the linear dispersion matrices.

Each linear dispersion matrix may be represented by a matrix element, the component-wise condition depending, for each column of the linear dispersion matrices, on at least one of the real dimensions of the product between a component of the matrix element representing the first linear dispersion matrix and the complex conjugate of a component of the matrix element representing the second linear dispersion matrix, the component-wise condition being satisfied if the at least one real dimension of the product is null, for each column of the linear dispersion matrices.

The linear dispersion matrices may be represented by matrix representations, in the basis of a given Algebra, the matrix elements corresponding to the elements of the integral basis of the number field used to construct the code.

The transmission channel being represented by an equivalent channel matrix, the method may comprise generating a space-time block code, in response to at least one constraint identifying a set of pairs of position indexes related to the equivalent channel matrix, the step of generating the space-time block code comprising, for each pair of position indexes:

a. selecting a pair of linear dispersion matrices such that the indexes of the two linear dispersion matrices of each pair corresponds to the position indexes of the pair of position indexes,
b. determining the components of the linear dispersion matrices of the selected pair so that the selected pair of linear dispersion matrices satisfies the component-wise condition.

The constraint may comprise an orthogonality constraint related to a set of orthogonal pairs of column vectors of the equivalent channel matrix, and each pair of position indexes corresponds to the two column indexes of the column vectors of one of the pairs of column vectors of the equivalent channel matrix.

The constraint may comprise an orthogonality constraint related to a minimal number of orthogonal pairs of column vectors of the equivalent channel, the method comprising selecting a number of pairs of the column vectors of the equivalent channel matrix and wherein, each pair of position indexes corresponds to the two column indexes of the column vectors of one of the selected pair of column vectors of the equivalent channel matrix.

Alternatively, the constraint may comprise an orthogonality constraint related to at least one target zero-valued position of the upper triangular matrix R obtained from the QR decomposition of the equivalent channel matrix, each target zero valued-position being defined by a pair of indexes comprising a line index and a column index, each pair of position indexes corresponding to the pair of indexes of one of the target zero-valued positions.

The constraint may comprise an orthogonality constraint related to a minimal number of target zero-valued positions of the upper triangular matrix R obtained from the QR decomposition of the equivalent channel matrix, the method comprising selecting a number of target zero-valued positions at least equal to the minimal number, each target zero-valued position being defined by a pair of indexes comprising a line index and a column index, and wherein each pair of position indexes corresponds to the pair of indexes of one of the target zero-valued positions.

According to another embodiment, the method previously comprises initializing a partition of the set of the Linear Dispersion matrices into at least two disjoint groups, the step of generating at least some of the linear dispersion matrices comprising iteratively generating the linear dispersion matrices of a given partition based on the previously generated partitions.

The partition may depend on a predefined class of code.

The class of code may be one of the following classes of codes: multi-group decodable code class, fast decodable code class, fast-group decodable code class, block orthogonal code classes.

The method may comprise previously receiving an initial space time block code comprising a set of the Linear Dispersion matrices grouped by partitions, the step of initializing the partitions comprising defining the partitions from the partitions of the initial space time block code.

There is also provided a space-time block code (STBC) for encoding a digital data sequence comprising a set of independent symbols to be transmitted through a transmission channel in a communication system, the space-time block code being represented by a set of linear dispersion matrices in a linear dispersion representation, each linear dispersion matrix comprising components having complex values, the linear dispersion matrices comprising at least one pair of linear dispersion matrices satisfying component-wise conditions, each pair comprising a first linear dispersion matrix and a second linear dispersion matrix, the component-wise conditions comprising a component-wise condition between the components of the first linear dispersion matrix and the components of the second linear dispersion matrix.

The component-wise condition may depend, for each column of the linear dispersion matrices, on at least one of the real dimensions of the product between a component of the first linear dispersion matrix and the complex conjugate of a component of the second linear dispersion matrix, the component-wise condition being satisfied if the at least one real dimension of the product is null, for each column of the linear dispersion matrices.

Each linear dispersion matrix may be represented by a matrix element, and the component-wise condition depends, for each column of the linear dispersion matrices, on at least one of the real dimensions of the product between a component of the matrix element representing the first linear dispersion matrix and the complex conjugate of a component of the matrix element representing the second linear dispersion matrix, the component-wise condition being satisfied if the at least one real dimension of the product is null, for each column of the linear dispersion matrices.

The transmission channel being represented by an equivalent channel matrix, the indexes of the two linear dispersion matrices of each pair of the linear dispersion matrices satisfying the component-wise condition may correspond respectively to the indexes of two columns of the equivalent channel matrix that are mutually orthogonal.

The equivalent channel matrix being associated with an upper triangular matrix according to a QR decomposition, the indexes of the two linear dispersion matrices of each pair of the linear dispersion matrices satisfying the component-wise condition may correspond respectively to a position of the upper triangular matrix R associated with a zero value.

The number of pairs of the linear dispersion matrices satisfying the component-wise condition may correspond to a number of positions of the upper triangular matrix R associated with a zero value.

There is also provided a device for encoding a data stream to be transmitted through a communication channel using such space-time block code.

The invention further provides a transmitter for transmitting an encoded data stream through a communication channel, the transmitter comprising such device.

The invention additionally provides a receiver for decoding a data stream, the data stream being encoded using a space-time block code according to one of the previous features.

The invention also provides a computer program product comprising instructions for carrying out the steps of the method space-time block code generation when the computer program is executed on a suitable computer device.

The invention enables transmission of a digital data stream adapted to a target diversity and/or a target coding rate, for any number of transmit antennas and any number of receive antennas, which simultaneously offers a target diversity order and a low decoding complexity.

Further advantages of the present invention will become clear to the skilled person upon examination of the drawings and detailed description. It is intended that any additional advantages be incorporated herein.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

FIG. 10 illustrates an exemplary zero-configuration of a triangular matrix obtained for an exemplary Golden Code;

FIG. 11 illustrates an exemplary zero-configuration of a triangular matrix obtained for an exemplary 4×4 Perfect Code;

FIG. 12 illustrates an exemplary triangular matrix as a result of a permutation applied to a triangular matrix;

FIG. 13 illustrates an exemplary triangular matrix as a result of another permutation applied to a triangular matrix;

FIG. 14 illustrates an exemplary triangular matrix as a result of still another permutation applied to a triangular matrix; and

DETAILED DESCRIPTION

Figure 1:
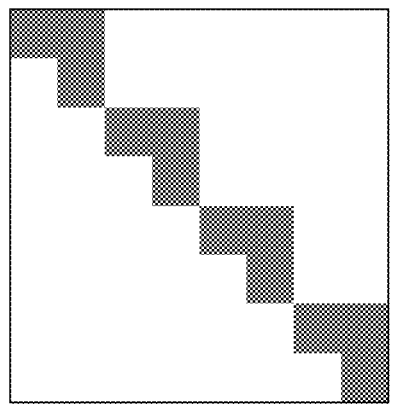
FIG. 1 illustrates an exemplary zero-configuration of an upper triangular matrix obtained for a family of multi-group decodable codes.

Embodiments of the invention provide systems and methods of generating Space-Time block Codes (STBC) for encoding a data sequence that is to be transmitted over a transmission channel in a communication system, depending on the desired maximum-likelihood (ML) decoding complexity and on targeted performance.

Specifically, the linear STBCs may be generated to encode a data sequence comprising k complex information symbols to be transmitted through the transmission channel. The k complex information symbols are represented by a complex-valued symbols vector s with $s=[s_1, \ldots s_k]^t$, with $s_j$ representing one of the k symbols ($1 \leq j \leq k$). The notation $A^t$ with A representing a given matrix designates the transpose of matrix A.

A space time block code is defined by a $n_t \times T$ transmission matrix $X \in \mathbb{C}^{n_t \times T}$, with T representing the number of time slots for transmission of one block of coded symbols (length of the STBC) and $n_t$ representing the number of transmit antennas. Each entry $x_{it}$ of the transmission matrix X represents an encoded symbol that will be transmitted to the antenna i (with $1 \leq i \leq n_t$) at time t (with $1 \leq t \leq T$). The transmission matrix is thus characterized by three parameters [T, $n_t$, k]:

The parameter $n_t$ corresponding to the number of transmit antennas in the communication system, The parameter T corresponding to length of the STBC, and The parameter k corresponding to the number of complex information symbols that are to be encoded by the STBC.

According to a Linear Dispersion (LD) decomposition representation, the transmission matrix X can be decomposed into a linear combination of weight matrices $A_l$, with $l=1, \ldots, 2k$, corresponding to the real and imaginary parts of each data symbol and its conjugate a Space-time Block Code (STBC). The weight matrices $A_l$ (also referred to as "LD matrices" or Linear Dispersion matrices) form a finite set of complex linearly independent matrices, with $n_t$ rows and T columns can be represented by a finite set of complex linearly independent matrices $A_l$, with $l=1, \ldots, 2k$, also referred to as "matrices LD" (acronym for Linear Dispersion) or "weight matrices", with $n_t$ rows and T columns.

To facilitate the understanding of certain notations used in the following description of certain embodiments, the following definitions are provided:

Superscripts ".$^t$" and ".$^H$" and ".*" respectively denote transposition, Hermitian transposition, and complex conjugation;

$\mathbb{Z}$ and $\mathbb{C}$ denote respectively the ring of rational integers and the field of complex numbers, a complex number $x=\Re(x)+i\Im(x))$ is defined by the two real dimensions which comprise the real part $\Re(x)$ and the imaginary part, $\Im(x)$.

in the context of complex representation, "i" designates the complex number such that $i^2=-1$. In the following description, an Italics and bold character may be used to represent the complex number when deemed necessary for clarity to distinguish between the complex number i and a row or column index of a matrix also noted "i".

In addition, $1_n$ denotes the n×n identity matrix.

Furthermore, for a complex number x, the operator $(\tilde{\cdot})$ from $\mathbb{C}$ to $\mathbb{R}^2$ is defined such that $\tilde{x}=[\Re(x), \Im(x)]^t$ where $\Re(x)$ and $\Im(x)$ denote the real and imaginary parts of x respectively (hence $x=\Re(x)+i\Im(x)$) in complex notation). This operator can also be extended to a complex vector $x=[x_1, \ldots, x_n]^t$ with $x \in \mathbb{C}^n$ according to: $\tilde{x}=[\Re(x_1), \Im(x_1), \ldots, \Re(n), \Im(x_n)]$.

The operator $(\bar{\cdot})$ from $\mathbb{C}$ to $\mathbb{R}^2$ is defined as $\bar{x}=[-\Im(x), \Re(x)]^t$;

The operator $(\check{\cdot})$ from $\mathbb{C}$ to $\mathbb{R}^{2 \times 2}$ is defined as:

$$\check{x} \triangleq \begin{bmatrix} \Re(x) & -\Im(x) \\ \Im(x) & \Re(x) \end{bmatrix}$$

The operator $(\check{\cdot})$ can be in a similar way extended to n×n matrices by applying it to all the entries of the matrix which results in a 2n×2n real-valued matrix;

The operator $vec(\cdot)$ is defined as the operator that stacks the m columns of an n×m complex-valued matrix into an mn complex column vector;

The operator $\|\cdot\|$ denotes the Euclidean norm of a vector;

For a complex number $x \in \mathbb{C}$ such that $x = \Re(x) + i\Im(x)$ the trace form $Tr(x)$ is defined as: $Tr(x) = Tr_{\mathbb{Q}(i)/\mathbb{Q}}(x) = 2\Re(x)$.

An STBC code can thus be represented by the finite set of complex linearly independent LD matrices $A_l$, with $l=1, \ldots, 2k$, and k designating the number of independent information symbols per codeword, drawn from a complex constellation.

The coding rate of an STBC, noted r, is defined as the ratio between the number of symbols k the encoder takes at its input and number of period T for transmission of one block of coded symbols according to the follow formula $$r = \frac{k}{T}.$$

The code rate r corresponds to the number of complex symbols sent per channel realization (or channel use). When full rate codes are used $k=n_t \cdot T$, and $n_r \geq n_t$.

The transmit diversity is given by $n_t$ where $n_t$ designates the number of transmit antennas.

Certain embodiments provide a method of generating a space-time block code (STBC) for encoding a digital data sequence comprising a set of independent symbols to be transmitted through a transmission channel in a communication system, the space-time block code being represented by a given number of linear dispersion matrices in a Linear dispersion representation.

The method may comprise generating at least some of the linear dispersion matrices so as to satisfy a target diversity order and/or a target coding rate, while guarantying a low decoding complexity.

Alternatively, the method may comprise generating at least some of the linear dispersion matrices so as to provide a target configuration of mutually orthogonal vector columns in the equivalent channel matrix.

According to another embodiment, the method may comprise generating at least some of the linear dispersion matrices so as to provide a target configuration of the zero valued components in the upper triangular matrix associated with the equivalent channel matrix.

In still another application of the invention, there is provided a method of generating a space-time block code (STBC) for encoding a digital data sequence comprising a set of independent symbols to be transmitted through a transmission channel in a communication system, the method comprising receiving an initial space-time block code (STBC) represented by a given number of linear dispersion matrices in a Linear dispersion representation and updating at least some of the linear dispersion matrices of the initial space-time block code (STBC) to satisfy a target diversity order and/or a target coding rate, while guarantying a low decoding complexity.

According to still another application of the invention, there is provided a method of generating a space-time block code (STBC) for encoding a digital data sequence, the method comprising receiving an initial space-time block code (STBC) represented by a given number of linear dispersion matrices in a Linear dispersion representation and updating at least some of the linear dispersion matrices of the initial space-time block code (STBC) to satisfy a target low decoding complexity.

According to yet another application of the invention, there is provided a method of generating a space-time block code (STBC) for encoding a digital data sequence, the method comprising receiving an initial space-time block code (STBC) represented by a given number of linear dispersion matrices in a Linear dispersion representation and updating at least some of the linear dispersion matrices of the initial space-time block code (STBC) depending on at least one decoding parameter.

In another application of the invention, there is provided a method of determining the ML decoding complexity of a tree-search based decoder using a space-time block code (STBC) represented by a given number of linear dispersion matrices in a Linear dispersion representation, the method comprising determining the complexity from a condition between the components of a set of selected pairs comprising two linear dispersion matrices from said linear dispersion matrices.

Alternatively, the method of determining the ML decoding complexity of a tree-search based decoder using a space-time block code (STBC) may comprise determining the complexity from the ordering of the linear dispersion matrices.

In still another application of the invention, there is also provided a method of determining the low-complexity ML decodable code class (multi-group decodable code class, fast decodable code class, fast-group decodable code class, block orthogonal code class) of a given space-time block code (STBC), the space-time block code being represented by a given number of linear dispersion matrices in a Linear dispersion representation, the method comprising determining the class from component-wise conditions related to a set of selected pairs of linear dispersion matrices. The determination of the code class may be used to adapt the decoding scheme (for example by switching to bloc decoding or parallelization).

Embodiments of the invention also provides a space-time block code (STBC) for encoding a digital data sequence comprising a set of independent symbols to be transmitted through a transmission channel in a communication system, the space-time block code being represented by a set of linear dispersion matrices in a linear dispersion representation, the linear dispersion matrices comprising at least one pair of linear dispersion matrices satisfying component-wise conditions, each pair comprising a first linear dispersion matrix and a second linear dispersion matrix, the component-wise conditions comprising a component-wise condition between the components of the first linear dispersion matrix and the components of the second linear dispersion matrix.

Considering $n_t$ transmit antennas and $n_r$ receive antennas, and noting X the codeword matrix X, with $X \in \mathbb{C}^{n_t \times T}$ sent over the transmission channel, with X belonging to a codebook C, using the LD decomposition form, the signal matrix X, corresponding to the signal sent by the transmitter, the receiver gets a noisy and faded version of this codeword matrix, can be written as a function of the LD matrices $A_l$ as follows:

$$X = \sum_{i=1}^{k} (\Re(s_i) A_{2i-1} + \Im(s_i) A_{2i}) \qquad (1)$$

In Equation (1), and $\Re(s_i)$ and $\Im(s_i)$ correspond respectively to the real and imaginary parts of the $s_i$ complex information symbols.

On the other hand, the complex-valued signal received through the channel is represented by the complex-valued output matrix Y as follows:

$$Y = HX + Z \quad (2)$$

In Equation (2), the channel fadings are represented by $H \in \mathbb{C}^{n_r \times n_t}$, and $Z \in \mathbb{C}^{n_r \times T}$ designates a noise matrix which is a complex-valued Additive White Gaussian Noise (AWGN) matrix of independent and identically distributed (i.i.d.) entries of variance N_0 per real-valued dimension, for a channel with Additive White Gaussian Noise (AWGN) subjected to fading.

The receiver decodes the received signal represented by matrix Y according to the Maximum Likelihood criterion. More specifically, considering a coherent transmission and assuming that the channel matrix H is perfectly known (estimated) at the receiver (and that the fadings hij are complex circularly symmetric Gaussian random variables of zero-mean and unit variance), the receiver will seek an estimate $\hat{X}$ of the transmitted codeword X by solving the minimization problem given by:

$$\hat{X} = \text{argmin}_{X \in \mathcal{C}} \|y - HX\|^2 \quad (3)$$

In equation (3), H designating the channel matrix.

ML decoding thus amounts to find the codeword matrix that minimizes the squared norm:

$$m(X) = \|y - HX\|^2 \quad (4).$$

The complexity of ML decoding is determined by the minimum number of values of m(X) that needs to be computed to find the ML solution. The receiver will favor the codewords that minimize the above metric m(X).

One way to ensure a lower complexity than the high complexity of the exhaustive search consists in applying a tree-search based decoding that exploits a triangular structure of the ML metric. Such triangular structure is obtained by transforming the complex-valued system into a real-valued one using a vectorization operator $\tilde{\text{vec}}(\ )$ and complex-to-real transformations $(\dot{\cdot})$ and $(\check{\cdot})$:

$$\tilde{\text{vec}}(Y) = H_{eq}\tilde{s} + \tilde{\text{vec}}(Z) \quad (5)$$

The obtained real system can be rewritten as:

$$y = H_{eq}\tilde{s} + z \quad (6)$$

In equation (6), $H_{eq}$ designates the equivalent channel matrix given by:

$$H_{eq} = (I_T \otimes \check{H})G \quad (7)$$

In Equation 7, $G \in \mathbb{R}^{2n_t T \times 2k}$ designates the generator matrix of the linear code STBC and satisfies $\tilde{\text{vec}}(X) = G\tilde{s}$. The generator matrix G can be expressed as a function of the linear weight matrices $A_l$, with $l = 1, \ldots, 2k$. Particularly, generator matrix G can be rewritten as:

$$G = [\tilde{\text{vec}}(A_1) | \tilde{\text{vec}}(A_2) | \ldots | \tilde{\text{vec}}(A_{2k})] \quad (8)$$

It should be observed that the ordering of the weight matrices in the LD form corresponds to the order of the information symbols $\Re(s_1), \Im(s_1), \ldots, \Re(s_k), \Im(s_k)$, which corresponds to the considered order in the complex-to-real transformation using the complex-to-real transformation operator $(\dot{\cdot})$. Accordingly, any change of the ordering of the information symbols results in a similar modification in the ordering of the weight matrices;

Using the equivalent system based on the equivalent channel matrix $H_{eq}$ and a QR decomposition of the channel matrix $H_{eq} = QR$, with $Q \in \mathbb{R}^{2n_r T \times 2k}$ designating an orthogonal matrix and $R \in \mathbb{R}^{2k \times 2k}$ is an upper triangular matrix. The ML decoding metric is equivalently written by:

$$m(\tilde{s}) = \|y - H_{eq}\tilde{s}\|^2 = \|Q^t y - R\tilde{s}\|^2 \quad (9)$$

In sphere-based decoders, the complexity can be alleviated thanks to zero entries in the upper triangular matrix R, that depend on the used code and the ordering of the real and imaginary parts of the symbols in the vector $\tilde{s}$ and accordingly the ordering of the weight matrices in the generator matrix G.

Considering that the equivalent channel matrix $H_{eq}$ comprises 2K column vectors $h_i^{eq}$, the equivalent channel matrix $H_{eq}$ can be written in column vector representation:

$$H_{eq} = [h_1^{eq}, h_2^{eq}, \ldots, h_{2k}^{eq}] \quad (10)$$

Considering that the orthogonal matrix Q comprises 2K column vectors $q_i$, the equivalent channel matrix Q can be written in column vector representation:

$$Q = [q_1, q_2, \ldots, q_{2k}] \quad (11)$$

Using Gram Schmidt orthogonalization, matrice R is then given by formula (12)

$$R = \begin{bmatrix} \|r_1\| & <q_1, h_2^{eq}> & <q_1, h_3^{eq}> & \ldots & <q_1, h_{2k}^{eq}> \\ 0 & \|r_2\| & <q_2, h_3^{eq}> & \ldots & <q_2, h_{2k}^{eq}> \\ 0 & 0 & \|r_3\| & \ldots & <q_3, h_{2k}^{eq}> \\ \vdots & \vdots & \vdots & \ddots & \ldots \\ 0 & 0 & 0 & \ldots & \|r_{2k}\| \end{bmatrix} \quad (12)$$

In matrix (12), $$r_1 = h_1^{eq}, \quad q_1 = \frac{r_1}{\|r_1\|}.$$

Further, for $i = 2, \ldots, 2k$, the definition of the elements $r_i$ is given by:

$$r_i = h_i^{eq} - \sum_{j=1}^{i-1} <q_j, h_i^{eq}> q_j \quad (13)$$

with $q_i = \frac{r_i}{\|r_i\|}$ \quad (14)

Accordingly, each component $R_{ij}$ of the upper triangular matrix R can be expressed as follows:

$$R_{ij} = <q_j, h_i^{eq}> = \frac{1}{\|r_i\|}\left[ <h_i^{eq} - \sum_{k=1}^{i-1} <q_k, h_i^{eq}> q_k, h_j^{eq}> \right] \quad (14)$$

As a result:

$$R_{ij} = \frac{1}{\|r_i\|}\left[ <h_i^{eq}, h_j^{eq}> - \sum_{k=1}^{i-1} <q_k, h_i^{eq}> <q_k, h_j^{eq}> \right] = \frac{1}{\|r_i\|}(C_{ij} + D_{ij})$$

Hence, to satisfy the condition $R_{ij}=0$, it is sufficient to have:
1. $C_{ij}=\langle h_i^{eq}, h_j^{eq}\rangle=0$ which corresponds to the orthogonality condition between the $i^{th}$ column and the jth column; and
2. $D_{ij}=\Sigma_{k=1}^{i-1} R_{ki}R_{kj}=0$, as $R_{ki}=\langle q_k, h_i^{eq}\rangle$ and $R_{kj}=\langle q_k, h_j^{eq}\rangle$ The complexity of the tree-based search decoding implemented by the decoder at the received end, and specifically the sphere-based tree search, depends on the branch computations in the decoding tree. However, zeros valued entries in the matrix R involve removal of a number of entries in the decoding tree. As a result, Zero entries of R, accelerate the metric computations in the spherical decoder branches. Zero entries of R therefore improve the decoding complexity (minimum number of values of m(X) that should be computed in the ML decoding).

Low decoding complexity is conventionally achieved by exploiting the orthogonality between the information symbols, and thus the orthogonality between the columns of the orthogonal channel matrix $H_{eq}$.

Several STBC designs have been proposed to achieve orthogonality between the columns of the equivalent channel matrix (condition 1), and hence solve the minimization problem, while ensuring a reduced-decoding complexity.

According to the conventional Hurwitz-Radon approach, a mutual orthogonality criterion, known as the Hurwitz-Radon criterion, between the weight matrices of the STBC has been proposed to ensure that a $i^{th}$ column and a $j^{th}$ column of the equivalent channel matrix $H_{eq}$ be orthogonal, as disclosed in:

J. Radon. Lineare scharen orthogonaler matrizen. in Abhandlungen aus dem Mathematischen Seminar der Hamburgishen Universität, 14:1-14, 1922;

b. K. P. Srinath and B. S. Rajan. Low ML-decoding complexity, large coding gain, full-rate, full-diversity stbcs for 2×2 and 4×2 MIMO systems. Selected Topics in Signal Processing, IEEE Journal of, 3(6):916-927, December 2009.

Specifically, for an STBC with k independent complex information symbols and 2k linearly independent weight matrices A_l, with l=1, . . . , 2k, the weight matrices A_(l) according to a conventional Hurwitz-Radon criterion satisfy the following Mutual Orthogonality condition, for any index i, j with i≠j, i≥1, and j≤2k:

$$A_i A_j^H + A_j A_i^H = 0_{n_t} \quad (15).$$

The verification of such condition ensures that the $i^{th}$ and $j^{th}$ columns of the equivalent channel matrix $H_{eq}$ are orthogonal.

To address the problem of ML decoding with low complexity, group decodable codes families have been proposed. Such code families have the property that the information symbols of the code can be partitioned into several groups, and each group of symbols can be ML decoded independently of the other symbol groups.

Particularly, the Hurwitz-Radon criterion (also referred to hereinafter as HR criterion) has been used to construct families of low-complexity ML decodable codes such as Multiple-group decodable codes, Fast decodable codes, Fast-group decodable codes, and Block orthogonal codes. It should be noted that these family of low-complexity ML decodable codes satisfy per construction the second condition related to zero-valued components in the upper triangular matrix R: $D_{ij}=\Sigma_{k=1}^{i-1} R_{ki}R_{kj}=0$.

Multi-Group Decodable Codes (HR):

For multi-group decodable STBCs, the weight matrices are partitioned into groups such that the ML decoding metric is decoupled into sub metrics. As a result, the members of a same group may be decoded jointly.

An STBC is said to be a Multi-group decodable code (also referred to as "g-group sphere decodable code") if there exists a partition of $\{1, \ldots, 2k\}$ into g non-empty subsets $\Gamma_1, \ldots, \Gamma_g$ such that $A_l A_m^H + A_m A_l^H = 0$, whenever $l \in \Gamma_i$ and $m \in \Gamma_j$, with i≠j. The corresponding upper triangular matrix R has the following form:

$$R = \begin{bmatrix} \Delta_1 & 0 & \cdots & 0 \\ 0 & \Delta_2 & \cdots & 0 \\ \vdots & \vdots & \ddots & \vdots \\ 0 & \cdots & \cdots & \Delta_g \end{bmatrix} \quad (16)$$

An example of a conventional R matrix obtained for a Multiple-group decodable STBC is provided in FIG. 1. In FIG. 1, Black entries represent zero-valued components $R_{ij}$ and grey entries represent non-zero values.

Fast Decodable Codes (HR)

An STBC is said to be a Fast Sphere Decodable (FSD) code if there exists a partition of $\{1, \ldots, L\}$ where $L \leq 2k$ into g non-empty subsets $\Gamma_1, \ldots, \Gamma_g$ such that $\langle q_i, h_j \rangle = 0$ with i<j, whenever $i \in \Gamma_p$ and $j \in \Gamma_q$, with p≠q, where $q_i$ and $h_j$ are column vectors of respectively Q and $H_{eq}$. The corresponding triangular matrix R has then the following form:

$$R = \begin{bmatrix} \Delta & B1 \\ 0 & B2 \end{bmatrix} \quad (17)$$

In the matrix R given by formula (17), $\Delta$ represents an L×L block diagonal upper triangular matrix, B1 a rectangular matrix, B2 a square upper triangular matrix.

Figure 2:
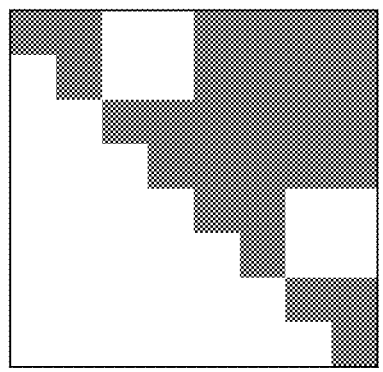
FIG. 2 illustrates an exemplary zero-configuration of an upper triangular matrix obtained for a family of fast decodable codes.

An example of a conventional upper triangular matrix R obtained for a fast decodable STBC is provided in FIG. 2. In FIG. 2, Black entries represent zero-valued components and grey entries represent non-zero values.

Fast-Group Decodable Codes (HR)

Considering a sphere decoder, a fast decodable group is associated with an upper triangular matrix R arranged such that when values are fixed for a set of symbols, the rest of the symbols become group decodable.

Specifically, an STBC comprising 2k weight matrices $A_l$, with l=1, . . . , 2k, is said to be fast group decodable if:
there exists a partition of $\{1, \ldots, 2k\}$ into g non empty subsets $\Gamma_1, \ldots, \Gamma_g$ such that:
$A_l A_m^H + A_m A_l^H = 0$, whenever $l \in \Gamma_i$ and $m \in \Gamma_j$, with i≠j, and
in any of the partition $\Gamma_i$, the relation $\langle q_{i,l_1}, h_{j,l_2} \rangle = 0$ is verified with $l_1=1, 2, \ldots, L_{i-1}$, and $l_2=1, 2, \ldots, L_i$, and $L_i \leq |\Gamma_i|$ where i=1, . . . , g.

The corresponding upper triangular matrix R has the following form:

$$R = \begin{bmatrix} R_1 & 0 & \cdots & 0 \\ 0 & R_2 & \cdots & 0 \\ \vdots & \vdots & \ddots & \vdots \\ 0 & \cdots & \cdots & R_g \end{bmatrix} \quad (18)$$

Further, the matrix R of formula (18) comprises at least one matrix $R_i$ having the following fast decodability form for i=1, ..., g:

$$R_i = \begin{bmatrix} \Delta_i & B_{i_1} \\ 0 & B_{i_2} \end{bmatrix} \quad (19)$$

In the matrix $R_i$ of formula (19), $\Delta_i$ represents a $L_i \times L_i$ block diagonal upper triangular matrix, $B_{i_1}$ a rectangular matrix, and $B_{i_2}$ a square upper triangular matrix.

Figure 3:
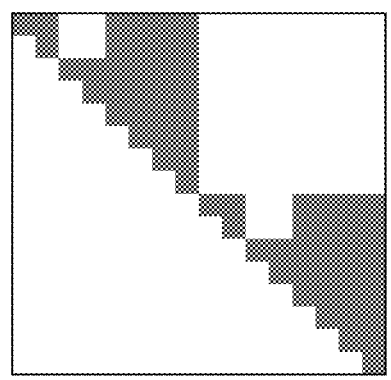
FIG. 3 illustrates an exemplary zero-configuration of an upper triangular matrix obtained for a family of fast group decodable codes.

An example of a conventional upper triangular matrix R obtained for a fast-group decodable STBC is provided in FIG. 3. In FIG. 3, Black entries represent zero-valued components and grey entries represent non-zero values.

Block Orthogonal Codes (HR)

Block Orthogonal codes are fast decodable codes that depict additional structural conditions on the R matrix that has the form:

$$R = \begin{bmatrix} R_1 & B_{12} & \cdots & B_{1\Gamma} \\ 0 & R_2 & \cdots & B_{2\Gamma} \\ \vdots & \vdots & \ddots & \vdots \\ 0 & 0 & \cdots & R_\Gamma \end{bmatrix} \quad (20)$$

In the upper triangular matrix R of formula (20), each matrix $R_i$ for i=1, ..., $\Gamma$ is full rank, block diagonal, upper triangular with k blocks $U_{i1}, \ldots, U_{ik}$ each of size $\gamma \times \gamma$ and the matrices $B_{ij}$, with i=1, ..., $\Gamma$ and j=i+1, ..., $\Gamma$ are non-zero matrices. Block-Orthogonal codes were defined and generalized, for codes with parameters ($\Gamma$,k,) in:

T. P. Ren, Y. L. Guan, C. Yuen, and E. Y. Zhang. Block-orthogonal space-time code structure and its impact on qrdm decoding complexity reduction. IEEE Journal of Selected Topics in Signal Processing, 5(8): 1438-1450, December 2011.

G. R. Jithamithra and B. Sundar Rajan. Construction of block orthogonal stbcs and reducing their sphere decoding complexity. In Wireless Communications and Networking Conference, pages 2649-2654, April 2013.

G. R. Jithamithra and B. S. Rajan. Construction of block orthogonal stbcs and reducing their sphere decoding complexity. IEEE Transactions on Wireless Communications, 13(5):2906-2919, May 2014.

The upper triangular matrix R being considered is an R matrix of an STBC comprising a set of weight matrices $\{A_1, \ldots, A_L\}$ and $\{B_1, \ldots, B_l\}$ such that R is represented by:

$$R = \begin{bmatrix} R_1 & E \\ 0 & R_2 \end{bmatrix} \quad (21)$$

In the above representation of the R matrix, $R_1$ is an L×L upper triangular block-orthogonal matrix with parameters ($\Gamma$−1,k,$\gamma$) E is an L×l matrix and $R_2$ is an l×l upper triangular matrix.

An STBC is block orthogonal with parameters ($\Gamma$,k,$\gamma$), if the following conditions are satisfied:

The set of matrices $\{B_1, \ldots, B_l\}$ is k-group decodable with $\gamma$ variables in each group;

The matrices $\{A_1, \ldots, A_L\}$ when used as weight matrices for an STBC yield an R having a block orthogonal structure with parameters ($\Gamma$−1,k,$\gamma$). When $\Gamma$=2, then L=1 and the matrices $\{A_1, \ldots, A_L\}$ are k-group decodable with variables in each group.

The set of matrices $\{A_1, \ldots, A_L, B_1, \ldots, B_l\}$ are such that the matrix R obtained is of full rank.

The matrix $E^t E$ is a block diagonal matrix with k blocks of size $\gamma \times \gamma$.

Accordingly, the Hurwitz-Radon (HR) approach is based on capturing the orthogonality between two weight matrices to obtain the orthogonality between corresponding columns of the equivalent channel matrix. Another existing approach derived from Hurwitz-Radon approach and referred to as the Hurwitz Radon Quadratic Form (also referred to hereinafter as "HRQF") provides a quadratic form of the Hurwitz-Radon criterion in the context of full diversity of codes, for instance to determine whether Quaternion algebras or Biquaternion algebras are division algebras, as disclosed in:

G. R. Jithamithra and B. Sundar Rajan. A quadratic form approach to ml decoding complexity of stbcs. CoRR, abs/1004.2844, 2010;

G. R. Jithamithra and B. S. Rajan. Minimizing the complexity of fast sphere decoding of stbcs. In IEEE International Symposium on Information Theory Proceedings, pages 1846-1850, July 2011;

G. R. Jithamithra and B. S. Rajan. Minimizing the complexity of fast sphere decoding of stbcs. IEEE Transactions on Wireless Communications, 12(12):6142-6153, December 2013.

According to the HRQF approach, the definition of the zero structure of the matrix R is based on associating to the HRQF a matrix U such that:

$$U_{ij} = \|A_i A_j^H + A_j A_i^H\|^2 \text{ and } U_{ij} = 0 \text{ if and only if } A_i A_j^H + A_j A_i^H = 0_{n_t}$$

This form has been used to determine sufficient conditions for an STBC to admit multi-group, fast and fast-group decidability according to the following conditions:

Multiple-Group Decodable Codes (HRQF):

An STBC with k independent complex symbols, comprising 2k weight matrices $A_l$, with l=1, ..., 2k, and an HRQF matrix U is said to be a Multiple-group decodable code (also referred to as "g-group sphere decodable code") if there exists an ordered partition of $\{1, \ldots, 2k\}$ into g non-empty subsets $\Gamma_1, \ldots, \Gamma_g$ such that $U_{ij}=0$, whenever $i \in \Gamma_p$ and $j \in \Gamma_q$, and $p \neq q$.

As used herein, an ordered partition refers to a partition $a_1, \ldots, a_n$ into g non-empty subsets $\Gamma_1, \ldots, \Gamma_g$ with cardinalities $k_1, \ldots, k_g$ such that:

$$\{a_1, \ldots, a_{k_1}\} \in \Gamma_1; \{a_{k_1+1}, \ldots, a_{k_1+k_2}\} \in \Gamma_2, \ldots,$$

$$\{a_{\sum_{i=1}^{g-1} k_i + 1}, \ldots, a_{\sum_{i=1}^{g} k_i}\} \in \Gamma_g.$$

Fast Decodable Codes

An STBC with k independent complex symbols, comprising 2k weight matrices $A_l$, with l=1, ..., 2k, and an HRQF matrix U is said to be a Fast Sphere Decodable (FSD) code if there exists a partition of $\{1, \ldots, L\}$ where L≤2k into g non-empty subsets $\Gamma_1, \ldots, \Gamma_g$ such that $U_{ij}=0$ whenever $i \in \Gamma_p$ and $j \in \Gamma_q$, and $p \neq q$.

Fast-Group Decodable Codes

An STBC with k independent complex symbols, comprising 2k weight matrices $A_l$, with l=1, ..., 2k, and an HRQF matrix U is said to be fast group decodable if there exists a partition of $\{1, \ldots, L\}$ where L≤2k into g non-empty subsets $\Gamma_1, \ldots, \Gamma_g$ with cardinalities $k_1, \ldots, k_g$ such that $U_{ij}=0$ whenever $i \in \Gamma_p$ and $j \in \Gamma_q$, and $p \neq q$, and if any group $\Gamma_i$ admits fast decodability.

Although, the Hurwitz-Radon based criterion (HR and HRQF) for capturing the orthogonality between two weight matrices is generally sufficient to ensure orthogonality of corresponding columns of the equivalent channel matrix, and hence provide a zero structure of the matrix R that ensures a reduced complexity, the inventors have found out that such Hurwitz-Radon (HR) based conditions are sufficient but unnecessary to achieve orthogonality between the columns of the equivalent channel matrix. Indeed, the application of the HR based criteria may result on unnecessary zero-valued components in the R matrix. Further, the HR based orthogonality criteria may be satisfied but the zeros may not be positioned in the upper triangular matrix R as targeted by the construction. Further, in some families of STBC, for instance in the case of Block orthogonal codes, the HRQF approach does not capture the zero structure of the R matrix. In such cases, it is possible to have entries $R_{ij} \neq 0$ even if the corresponding weight matrices $A_i$ and $R_j$ are HR orthogonal which is equivalent to have the corresponding entry in the HRQF matrix $U_{ij}=0$. Such configurations which are in contradictions with the HR criterion are not understood in the art. Also, the application of HR-based criterion to generate STBC does not allow to capture exactly the decoding complexity of STBCs codes.

The STBC generation method according to the embodiments of the invention provide reduced-complexity ML decodable linear STBCs for any arbitrary number of antennas, any arbitrary coding rate and/or any desired diversity gain based on a novel mutual orthogonality criterion.

The STBC generation method according to the embodiments of the invention may generate an STBC in response to one or more orthogonality constraints. In certain embodiment, the orthogonality constraints comprise specified pairs of columns $(h_i^{eq}, h_j^{eq})$ designating the $i^{th}$ column and a $j^{th}$ column of the equivalent channel matrix $H_{eq}$ which are required to be orthogonal, or alternatively a number N of pairs of columns of the equivalent channel matrix $H_{eq}$ which are required to be orthogonal. Alternatively, the orthogonality constraints may comprise a desired zero configuration of the upper triangular matrix R. Such configuration may be defined by a number of zero-valued components in the upper triangular matrix R and/or specified positions of zero-valued components in the upper triangular matrix R.

In addition, the orthogonality constraints may include a specified family of STBC, such as for example, the family of multi-group decodable, fast decodable and fast group decodable codes, so that the generated STBC will belong to the specified family. Particularly, depending on the type of code, the information symbols of the code may be partitioned into several groups so that each group of symbols can be ML decoded independent of other symbol groups.

With the STBC generation method according to certain embodiments, the decoding complexity may depend only on the weight matrices and their ordering, while not depending on the channel gains or the number of antennas.

The present invention may be implemented in a wireless communication system for decoding information symbols, comprising at least a transmitter for transmitting simultaneously a plurality of information symbols through a communication channel, and at least a receiver for receiving one or more of the symbols transmitted by the transmitter(s) in the form of independent signals. The communication channel may be any linear AWGN (Additive White Gaussian Noise) channel or any multipath channel. The communication channel may use any multiple access technique such as Time Division Multiple Access, Frequency Division Multiple Access, Code Division Multiple Access, and Space Division Multiple Access. In addition, the communication channel may use single-carrier or multi-carrier modulation formats such as OFDM (Orthogonal Frequency-Division Multiplexing) or FBMC (Filter Bank Multi-Carrier).

In another application to optical fiber-based communication systems, encoded data according to the various embodiments may correspond to the information symbols transmitted through the different polarization states of the optical fiber or propagating over the different modes of multi-mode fibers. In addition, a multiple access technique such as WDMA (Wavelength Division Multiple Access) may be used in such optical communication systems.

The transmitter may comprise any number $n_t$ of Transmit (Tx) antennas and the receiver may comprise any number $n_r$ of Receive (Rx) antennas.

An embodiment of the invention may be integrated in a transmitter, for example for the transmission of a digital data stream in a MIMO (Multiple Input Multiple Output) channel to be detected by a single user or by multiple users equipped with a receiver.

The wireless network environment may comprise a plurality of base stations (also referred to as "nodes" or "access points" or "cells" depending on the application context of the invention), each base station including a transmitter and a receiver including one or more antennas. Each station may communicate with other stations through a wireless connection.

Figure 4:
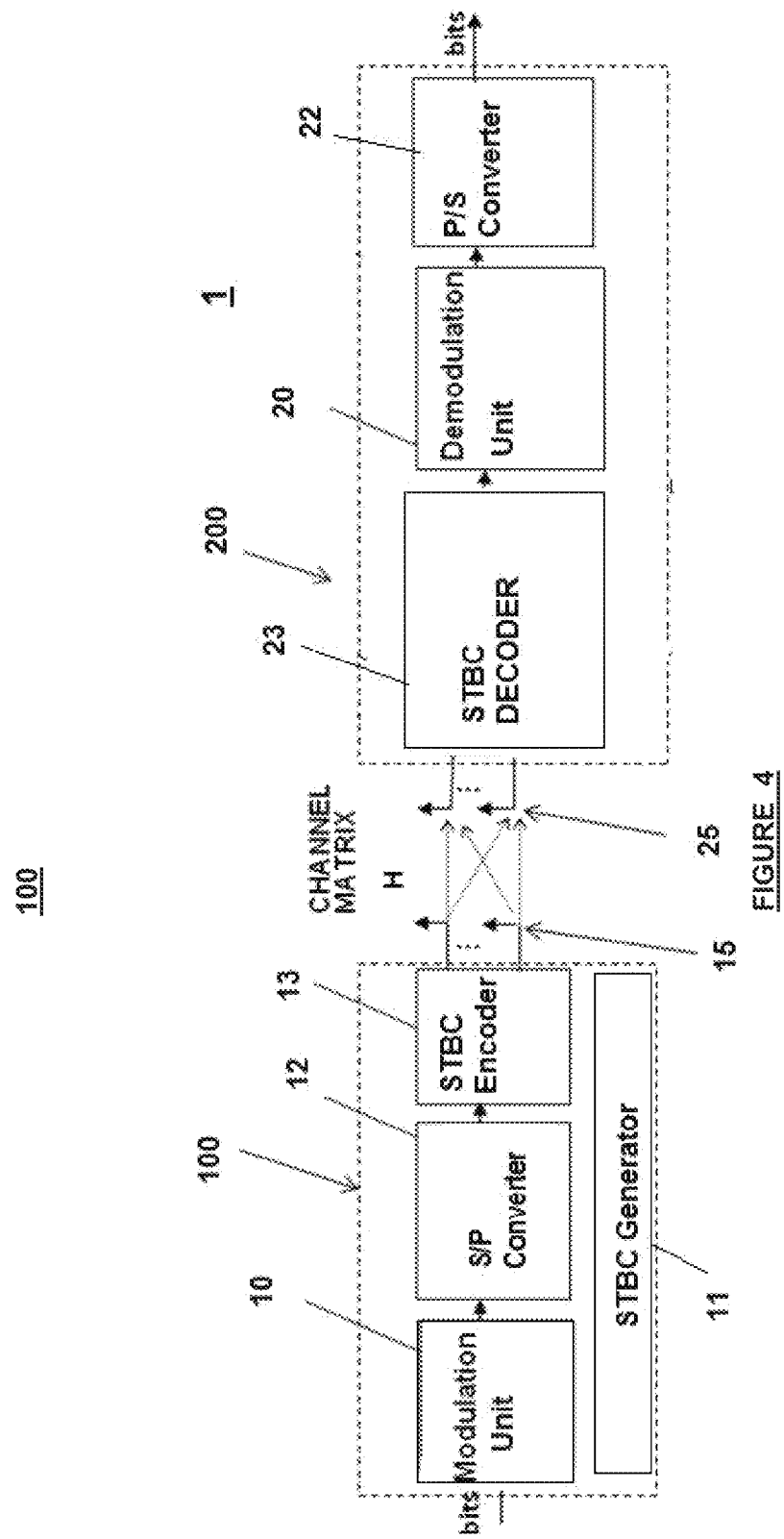
FIG. 4 is a block diagram of a MIMO system that uses a space-time code generator according to one embodiment of the present invention

Referring to FIG. 4, an exemplary wireless communication system 1 between a transmitter and a receiver in which a MIMO transmission is used, implementing an STBC (Space Time Block Code) code in transmission to distribute the symbols modulated over various degrees of freedom of the channel. Each transmitter 100 of a station may exchange data with a receiver 200 of another station according to the wireless communication system. The wireless network 1 may rely on a centralized architecture (a controller is provided to control the operation of the base stations) or a decentralized architecture (the base stations may communicate directly with one another). User Terminals (such as wireless devices, cellular phones, personal digital assistants, etc.), may communicate with one or more base stations on the forward link or on the reverse links. The user terminals may be fixed or mobile.

The MIMO configuration may be symmetric, in which case it includes a same number $(n_t)$ of Transmit antennas as the number $(n_r)$ of Receive antennas. Alternatively, the MIMO configuration may be asymmetric, in which case the number $(n_t)$ of Transmit antennas is different from the number $(n_r)$ of Receive antennas (in particular the number $n_r$, at the receive side, is higher than $n_t$, at the transmit side to avoid a rank deficiency).

The transmitter 100 can transmit a signal to a receiver 3 by means of a noisy MIMO channel. The transmitter 2 may include a Space-Time Block Codes (STBC) generator 11 (also referred to hereinafter as a "STBC generation device") according to certain embodiments. The STBC generator 11 is configured to generate a linear Space-Time Block Code for encoding the data sequence that is to be transmitted through the transmission channel in a communication system, the method is based on the construction of the Linear Dispersion matrices defining the code enabling to have zero entries in the R matrix obtained from the QR decomposition of the equivalent channel matrix of the transmission system, the zero entries are located in predefined chosen positions satisfying a component-wise mutual orthogonality criterion between the entries of the Linear Dispersion matrices.

The data transmitter 100 can in particular be integrated in the base stations.

In the transmitter 100, the information bits received from an information source are first modulated using modulation scheme by a modulator 10.

The data sequence to be transmitted is received from an information source in the form of information bits. In the transmitter 100, the data to be transmitted is first modulated by a modulation unit 10.

The modulation unit 10 is configured to modulate the information data according to a modulation scheme, such as for example a binary phase shift keying (BPSK), a quadrature phase shift keying (QPSK), a quadrature amplitude modulation (QAM), a pulse amplitude modulation (PAM), a phase shift keying (PSK), etc.

The modulation unit 10 may further include a constellation mapper to map the symbols onto a constellation. The following description will be made with reference to $2^q$-QAM constellations with q bits per symbol and for which the real and imaginary parts of the information symbols belong to a PAM modulation taking values in the set $[-(q-1), (q-1)]$ for illustrative purpose only. The skilled person will readily understand that the invention is not limited to such constellation and modulation types and that other type of constellations and modulations may apply (for example, the constellations may be hexagonal constellations).

The parallel symbol blocks are fed to the STBC encoder 14 which encodes each block of modulated symbols using the STBC codes generated by the STBC generator 11, which provides STBC channel symbols.

The transmitter 100 may include a Serial to Parallel (S/P) converter 12 to convert the stream of serial symbols received from the modulation unit 10 into parallel symbol blocks.

The STBC encoder 14 may include a memory (not shown) for storing the incoming symbols and a TX processor (not shown) for processing the stored data (e.g., generating the STBC, encoding, modulating) based on the coding and modulation schemes associated with the target coding rate selected for the user terminal schemes associated with the rate selected for the user terminal.

The STBC encoder 14 encodes each block of modulated symbols.

The STBC generator 11 previously generates an STBC code to be used for the encoding by the STBC encoder 14 that meet one or more orthogonality constraints which may comprise a desired mutual orthogonality configuration of the columns of the equivalent channel matrix $H_{eq}$ (specified pairs of column vectors of the equivalent channel matrix $H_{eq}$ that are required to be mutually orthogonal, or a number of pairs of column vectors of the equivalent channel matrix $H_{eq}$ that are required to be mutually orthogonal) and/or a desired zero-configuration of the matrix R (specified positions in the R matrix that are required to be zero-valued or a number of zero-valued positions in the R matrix). The generation of the STBC may take into account additional STBC constraints such as a target coding rate, a target complexity, a code family (Fast Decodable, multi-group decodable, etc.), and/or a number of weight matrices. The STBC thus generated by the STBC generator 11 is used by the STBC encoder 14 to encode the symbols.

The STBC encoder 14 then outputs the STBC encoded symbols to the $n_t$ transmit antennas 15 every time slot $t_s=1, \ldots, T$.

The transmit antennas 15 transmit the encoded symbols through the channel to the receiver 200.

The encoded signals are then transmitted to the receiver through the channel. In the channel, the signals may suffer from fading and Additive White Gaussian Noise may be added with the signal.

At the receiver 200, the signal is received by the $n_r$ antennas 25. The receiver comprises at least one linear STBC decoder 23 applying a decoding algorithm satisfying the ML criterion such as a tree-search based decoding algorithm (sphere decoder, sequential decoder, sb-stack decoder, etc.) to decode the received signal, and a parallel-to-serial converter 22. The nr receive antennas 25 receive the STBC symbols transmitted from the nt transmit antennas 15, the STBC decoder 23 decodes the STBC symbols and outputs the decoded STBC symbols to the demodulation unit 20. The parallel-to-serial converter 22 convert the estimated symbols into estimated information bits. It should be noted that the receiver 3 implements a reverse processing of the processing implemented in transmission. Accordingly, if the modulation unit 10 implements a single-carrier modulation, the demodulation unit 20 implements corresponding single-carrier demodulators (the same applies in case of multi-carrier modulation).

In embodiments where the STBC code may be generated in order so as to belong to a g-group decodable code family, the set of real symbols can be partitioned into g groups and the decoder at the receiver end can decode the symbols in each group separately.

The skilled person will readily understand that the various embodiments of the invention are not limited to specific applications. Exemplary applications of this new decoder include, with no limitation, multi-user communication systems, MIMO decoding in configurations implementable in wireless standards such as the WiFi (IEEE 802.11n), the cellular WiMax (IEEE 802.16e), the cooperative WiMax (IEEE 802.16j), the Long Term Evolution (LTE), the LTE-advanced, DVB, and 5G ongoing standardization.

In particular, the STBC method generation may have particular advantages for certain communication scenarios/systems, such as for example generation of Multi-group decodable codes in parallel MIMO-OFDM systems or generation of Fast decodable codes in Multi-user MIMO systems, although the invention is not limited to such applications.

In the transmitter side, the STBC generator 11 implements a novel orthogonality criterion, referred to as a "component-wise mutual orthogonality" criterion, to generate STBC adapted to a prescribed zero-configuration of the upper triangular matrix and hence to ensure a reduced decoding complexity. The inventors have found out and demonstrated that such criterion is sufficient to guaranty the orthogonality between two columns of the equivalent channel matrix $H_{eq}$.

More specifically, according to the component-wise mutual orthogonality criterion as implemented by the STBC generator, it has been determined that, to ensure that a given $i^{th}$ column and a $j^{th}$ column of the equivalent channel matrix $H_{eq}$ are mutually orthogonal, for any index i and j with i≠j, i≥1, and j≤2k and for l=1, ..., T, the generated STBC code comprising k independent complex symbols and 2k weight matrices $A_l$ (each weight matrix weight matrices $A_l$ comprising $n_t$ rows and T columns, where T represents the length of the STBC) with l=1, ..., 2k should satisfy mutual orthogonality criterion between the components $a_{ql}^{(i)}$ of the weight matrix $A_i$ and the components $a_{pl}^{(j)}$ of the weight matrix $A_j$. The mutual orthogonality criterion between the components $a_{ql}^{(i)}$ of the weight matrix $A_i$ and the components $a_{pl}^{(j)}$ of the weight matrix $A_j$ is satisfied if at least one of the following conditions is satisfied:

A. $Tr\left(a_{ql}^{(i)}\left(a_{pl}^{(j)}\right)^*\right) = 0, \forall p, q = 1, \ldots, n_t$  (22)

B. $Tr\left(ia_{ql}^{(i)}\left(a_{pl}^{(j)}\right)^*\right) = 0, \forall p \neq q, p \geq 1, q \leq n_t$  (23)

In equations (22) and (23), $a_{ql}^{(i)}$ (respectively $a_{pl}^{(j)}$) designates the component (also referred to as "entry") of the weight matrix $A_i$ (respectively $A_j$) at row q and column l (respectively at row p and column l). In equation (23), it should be noted that the notation "i" (first occurrence in the expression "$ia_{ql}^{(i)}\left(a_{pl}^{(j)}\right)^*$")

designates the complex number while (i) refers to the $i^{th}$ row of the matrix $A_i$.

In other words, the verification of at least one of condition (22) and (23) (trace forms for $a_{ql}^{(i)}\left(a_{pl}^{(j)}\right)^*$ and/or $ia_{ql}^{(i)}\left(a_{pl}^{(j)}\right)^*$ being equal to zero) is sufficient to ensure that the $i^{th}$ and $j^{th}$ columns of the equivalent channel matrix $H_{eq}$ are orthogonal (in other words, the scalar product of $h_i^{eq}$ and $h_j^{eq}$ is equal to zero: $\langle h_i^{eq}|h_j^{eq}\rangle = 0$).

It should be further noted that even if the case p=q has been excluded for equation (23), actually the orthogonality between the $i^{th}$ and $j^{th}$ columns of the equivalent channel matrix $H_{eq}$ is still satisfied p=q (as the term $Tr\left(ia_{ql}^{(i)}\left(a_{pl}^{(j)}\right)^*\right)$ does not have an impact on the term $\langle h_i^{eq}|h_j^{eq}\rangle$ in this case).

The novel component-wise mutual orthogonality criterion implemented by the STBC generator 11 is thus based on the values of the entries of weight matrices corresponding to column vectors of the equivalent channel matrix.

The STBC generation method and device, according to certain embodiments, may accordingly generate a space-time block code represented by a given number of linear dispersion matrices in a Linear dispersion representation, by determining, for every pair $(h_i^{eq}, h_j^{eq})$ of two column vectors of the equivalent channel matrix $H_{eq}$ that are to be orthogonal, the components of the two linear dispersion matrices $A_i$ and $A_j$ (or of two elements $v_i$, and $v_j$, respectively representing the two linear dispersion matrices) corresponding to the two column vectors $h_i^{eq}$ and $h_j^{eq}$ of the pair $(h_i^{eq}, h_j^{eq})$ so that the components of the first linear dispersion matrix (or of the first element $v_i$, representing the linear dispersion matrix) are mutually orthogonal with the components of the second linear dispersion matrix $A_j$ (or of the second element $v_j$, representing the linear dispersion matrix), i.e. so that, for each given matrix position of the weight matrices, any of the real dimensions (i.e. the real part (condition 22) or the imaginary part (condition 23)) of the mutual product involving the corresponding components, at that position, of two different weight matrices (or of two elements $v_i$, and $v_j$, representing the two linear dispersion matrices) is equal to zero.

As used herein, the mutual product is defined, for a given column l of the weight matrices, as the real dimension (i.e. real part or imaginary part) of the product between:
  a component $a_{ql}^{(i)}$ that belongs to the first weight matrix $A_i$ (respectively to the first element $v_i$, representing the linear dispersion matrix $A_i$), for any row q of the weight matrix $A_i$, and
  the complex-conjugate $\left(a_{pl}^{(j)}\right)^*$ of a component $a_{pl}^{(j)}$ that belongs to the second weight matrix $A_j$ (respectively to the second element $v_j$, representing the linear dispersion matrix $A_j$), for any row p of the weight matrix $A_j$.

It is an advantage of the STBC generation method and device of the invention, to overcome the drawbacks of the conventional HR-based approaches conventionally used to construct STBC codes related to over-sizing, and failure to capture all the families of low-complexity ML decoding STBCs. Indeed, the HR based criterion for an STBC with k independent complex information symbols and 2k linearly independent weight matrices $A_l$; with l=1, ..., 2k, defines the Mutual Orthogonality condition, for any index i, j with i≠j, i≥1, and j≤2k, defined as $A_iA_j^H + A_jA_i^H = 0_{n_t}$ according to equation 9, involves that the summation of the trace forms equal to zero $\left(\frac{1}{2}\sum_{l=1}^{n_t} Tr\left(a_{pl}^{(i)}\left(a_{pl}^{(j)}\right)^*\right)\right) = 0,$ for any p=1, ..., $n_t$). Hence, the condition for having orthogonality between two columns in the equivalent channel matrix $H_{eq}$ as proposed using the HR-based approaches (HR and HRQF) only captures the summation of the trace forms of the components $a_{pl}^{(i)}\left(a_{pl}^{(j)}\right)^*$ and imposes that this summation be equal to zero for all p=1, ..., $n_t$. In such cases, the HR mutual orthogonality is satisfied and the entry $U_{ij}$ of the HRQF matrix is equal to 0 without having orthogonality of columns i and j of the equivalent channel matrix and thus the corresponding entry in the R matrix $R_{ij} \neq 0$.

In contrast, according to the component-wise mutual orthogonality criterion as implemented by the STBC generator 11 and the STBC generation method according to the invention, in order to ensure orthogonality between the $i^{th}$ and $j^{th}$ columns of $H_{eq}$, it is sufficient to have the individual trace forms for $a_{pl}^{(i)}\left(a_{pl}^{(j)}\right)^*$ or $ia_{pl}^{(i)}\left(a_{pl}^{(j)}\right)^*$ equal to 0. Therefore, it is not required to ensure that the summation of the trace forms equal to zero. In the particular case where the individual trace forms are null, this involves that the summation is also equal to zero. However, if the summation is equal to 0, the individual trace forms can be different of 0. Accordingly, the STBC generator 11 and the STBC generation method according to the various embodiments of the invention are based on the implementation of component-wise mutual orthogonality conditions that provides reduced-complexity ML decodable linear STBCs for any number of antennas and any target coding rate (including high-rates).

The application of the generation method to generate specific code classes of low-complexity ML decoding is based on recurrence on the partitions of the Linear Dispersion matrices defining the linear code.

Multiple-Group Decodable Codes:

A generated STBC comprising k independent symbols, and 2k weight matrices $A_l$ is said to be g-group decodable if there exists a partition of $\{1, \ldots, 2k\}$ into g non empty subsets $\Gamma_1, \ldots, \Gamma_g$ such that for all $l=1, \ldots, T$, whenever $i \in \Gamma_p$ and $j \in \Gamma_q$, with $p \neq q$, satisfying at least one of conditions 20 and 21:

C. $Tr(a_{ql}^{(i)}(a_{pl}^{(j)})^*) = 0, \forall p, q = 1, \ldots, n_t$ (22)

$Tr(ia_{ql}^{(i)}(a_{pl}^{(j)})^*) = 0, \forall p \neq q, p \geq 1, q \leq n_t$ (23)

B. Fast Decodable Codes:

An STBC comprising k independent symbols, and 2k weight matrices $A_l$ is said to be fast Sphere Decodable code if there exists a partition of $\{1, \ldots, L\}$ where $L \leq 2k$ into g non empty subsets $\Gamma_1, \ldots, \Gamma_g$ such that for all $l=1, \ldots, T$, whenever $i \in \Gamma_p$ and $j \in \Gamma_q$, with $p \neq q$, satisfying at least one of condition 22 and 23:

A. $Tr(a_{ql}^{(i)}(a_{pl}^{(j)})^*) = 0, \forall p, q = 1, \ldots, n_t$ (22)

B. $Tr(ia_{ql}^{(i)}(a_{pl}^{(j)})^*) = 0, \forall p \neq q, p \geq 1, q \leq n_t$ (23)

C. Fast-Group Decodable Codes:

An STBC with k independent symbols, 2k weight matrices $A_l$; and an HRQF matrix U is said to be fast group decodable if there exists a partition of $\{1, \ldots, L\}$ where $L \leq 2k$ into g non empty subsets $\Gamma_1, \ldots, \Gamma_g$ with cardinalities $K_1, \ldots, K_g$ such that:

at least one of condition 22 and 22:

A. $Tr(a_{ql}^{(i)}(a_{pl}^{(j)})^*) = 0, \forall p, q = 1, \ldots, n_t$ (22)

B. $Tr(ia_{ql}^{(i)}(a_{pl}^{(j)})^*) = 0, \forall p \neq q, p \geq 1, q \leq n_t$ (23)

and if any group $\Gamma_i$ admits fast decodability.

D. Block Orthogonal Codes

Let the R matrix of an STBC with weight matrices $\{A_1, \ldots, A_L\}$ and $\{B_1, \ldots, B_J\}$ be:

$$R = \begin{bmatrix} R_1 & E \\ 0 & R_2 \end{bmatrix},$$

where $R_1$ is an $L \times L$ upper triangular block-orthogonal matrix with parameters $(\Gamma-1, k, \gamma)$, E is an $L \times l$ matrix and $R_2$ is an $l \times l$ upper triangular matrix. The STBC will be block orthogonal with parameters $(\Gamma, k, \gamma)$, if the following conditions are satisfied:

If there exists an ordered partition of the set of matrices $\{B_1, \ldots, B_J\}$ into k non empty subsets $\{S_1, \ldots, S_k\}$ each of cardinality $\gamma$ such that for all $l=1, \ldots, T$ at least one of the conditions (22) and (23) is satisfied whenever $i \in S_p$ and $j \in S_q$, with $p \neq q$:

A. $Tr(b_{ql}^{(i)}(b_{pl}^{(j)})^*) = 0, \forall p, q = 1, \ldots, n_t$ (22)

B. $Tr(ib_{ql}^{(i)}(b_{pl}^{(j)})^*) = 0, \forall p \neq q, p \geq 1, q \leq n_t$, (23)

and the matrices $\{A_1, \ldots, A_L\}$ when used as weight matrices for an STBC yield an R having a block orthogonal structure with parameters $(\Gamma-1, k\gamma)$. When $\Gamma=2$, then $L=1$ and the matrices $\{A_1, \ldots, A_L\}$ are k-group decodable with variables in each group.

The set of matrices $\{A_1, \ldots, A_L, B_1, \ldots, B_J\}$ are such that the matrix R obtained is of full rank.

The matrix $E'E$ is a block diagonal matrix with k blocks of size $\gamma \times \gamma$.

As known in the art interest of STBCs lie on coding and diversity gains. The STBC generation method and device provide coding and diversity gains which ensure the coded-system reliability and performance.

By applying the component-wise mutual orthogonality criterion, the STBC generation method and system can provide high-rate and low-complexity decoding STBCs.

Figure 5:
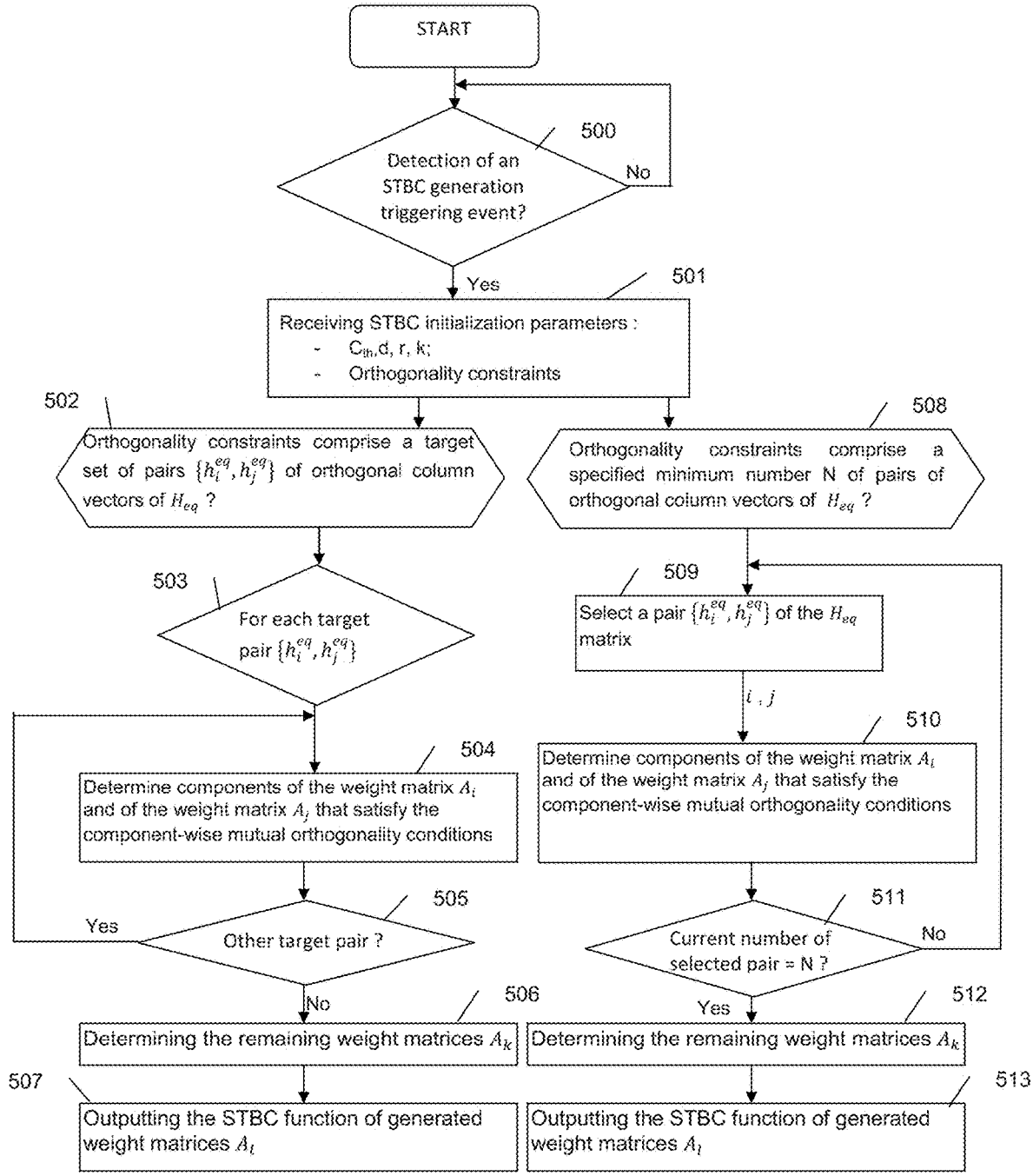
FIG. 5 is a flowchart depicting a space-time code generation method according to certain embodiments applying orthogonality constraints related to orthogonality of column vectors of the equivalent channel matrix.

FIG. 5 is a flowchart is presented that depicts the steps of generating an STBC, in response to a STBC generation triggering event.

In step 500, an STBC generation triggering event is detected. STBC generation triggering event may be any type of event requiring generation of a new or improved STBC such as an event related to system-level requirements/specifications for a given application (data, multimedia), for example like a required Quality-Of-Service (QoS), transmission reliability, or authorized complexity according to available resources.

In response to the STBC generation triggering event, a set of initialization parameters are retrieved in step 501.

The initialization parameters may comprise at least one or more orthogonality constraints and/or one or more STBC target parameters: The set of initialization parameters may further comprise target STBC parameters such as:

the target complexity $C_{th}$ under ML decoding, and/or the target diversity order d, and/or the target coding rate r, and/or the number of transmit and/or receive antennas, and/or a given family of low-complexity ML decodable class codes.

The set of initialization parameters may also comprise the number 2k of weight matrices that is to be associated with the STBC. The number of weight matrices may be determined by the number of encoded symbols or the coding rate.

In one embodiment, the orthogonality constraints may comprise a constraint related to the mutual orthogonality of at least one pair of column vectors in the equivalent channel matrix $H_{eq}$. In particular, the orthogonality constraint may designate a set of pairs $\{h_i^{eq}, h_j^{eq}\}$ of column vectors ($i^{th}$ and $j^{th}$ column vectors) of the equivalent channel matrix $H_{eq}$, identified by their indexes (i and j).

If the orthogonality constraints comprise the designation of a set of pairs $\{h_i^{eq}, h_j^{eq}\}$ of column vectors ($h_i^{eq}$ and $h_j^{eq}$) of the equivalent channel matrix $H_{eq}$ which are to be orthogonal (i.e. $<h_i^{eq}, h_j^{eq}>=0$), with i designating the $i^{th}$ column and j designating the $j^{th}$ column of the equivalent channel matrix $H_{eq}$ (step 502), an STBC comprising k independent complex symbols and 2k weight matrices $A_l$ (each weight matrix $A_l$ comprising $n_t$ rows and T columns, where T represents the length of the STBC) is generated such that, for each pair $\{h_i^{eq}, h_j^{eq}\}$ of column vectors of the equivalent channel matrix (step 503), components $a_{ql}^{(i)}$ of the weight matrix $A_l$ and the components $a_{pl}^{(j)}$ of the weight matrix $A_j$, are determined so as to satisfy the component-wise mutual orthogonality conditions according to condition 22 and/or 23 (i.e. individual trace forms for $$a_{ql}^{(i)}\left(a_{pl}^{(j)}\right)^* \text{ or } ia_{ql}^{(i)}\left(a_{pl}^{(j)}\right)^*$$

equal to zero), where i and j designate the two columns of the specified target pair ($h_i^{eq}, h_j^{eq}$) of the equivalent channel matrix $H_{eq}$ which are to be orthogonal (step 504) This step of determining component-wise mutual orthogonal weight matrices is iterated for each other target specified pair $\{h_i^{eq}, h_j^{eq}\}$ (step 505).

If it is determined that all the specified target pairs have been processed (505), the remaining weight matrices $A_k$ that have not yet been generated (hence for k different from the index of the columns of the equivalent channel matrix $H_{eq}$ which are comprised in a target orthogonal pair ($h_i^{eq}, h_j^{eq}$) as specified in the orthogonal constraint) may be determined either arbitrarily or according to a filling method taking into account additional constraints and/or the previously generated weight matrices.

In step 506, an STBC code constructed from the generated weight matrices is output, for example to encode the modulated symbols. Accordingly, the STBC thus generated satisfies the predefined target parameters and ensures that the specified target pairs of the equivalent channel matrices are orthogonal.

Alternatively, for an orthogonality constraint specifying a number N of target orthogonal column vector pairs in the equivalent channel matrix $H_{eq}$ (508), a first pair of column vectors of the equivalent channel matrix $H_{eq}$ may be selected (arbitrarily or according to a predefined selection method) in step 509, and the selected pair is processed according to step 510 similarly to step 504 (i.e. components $a_{ql}^{(i)}$ of the weight matrix $A_l$ and the components $a_{pl}^{(j)}$ of the weight matrix $A_j$, are determined to satisfy the component-wise mutual orthogonality conditions according to condition 22 and/or 23). Selection step 509 is then iterated for selecting a next pair of the equivalent channel matrix $H_{eq}$ and step 510 is repeated for the newly selected pair. The same process is iterated until a number of pairs corresponding to the target number N has been processed (511).

Similarly to step 506, in step 512 the remaining weight matrices $A_k$ that have not yet been generated (hence for k different from the index of the columns of the equivalent channel matrix $H_{eq}$ which are comprised in a pair ($h_i^{eq}, h_j^{eq}$) selected in step 509) may be determined.

In step 513, STBC code constructed from the generated weight matrices is output to an STBC encoder for example. Accordingly, the STBC thus generated satisfies the predefined target parameters and ensures that a minimal number N of column pairs of the equivalent channel matrices are orthogonal.

According to another embodiment, the orthogonality constraints may comprise a target zero-valued component configuration of the upper triangular matrix R. In addition, the STBC initialization parameters may comprise the designation of a family of code so that the decoding may be performed for independent group of symbols.

Figure 6:
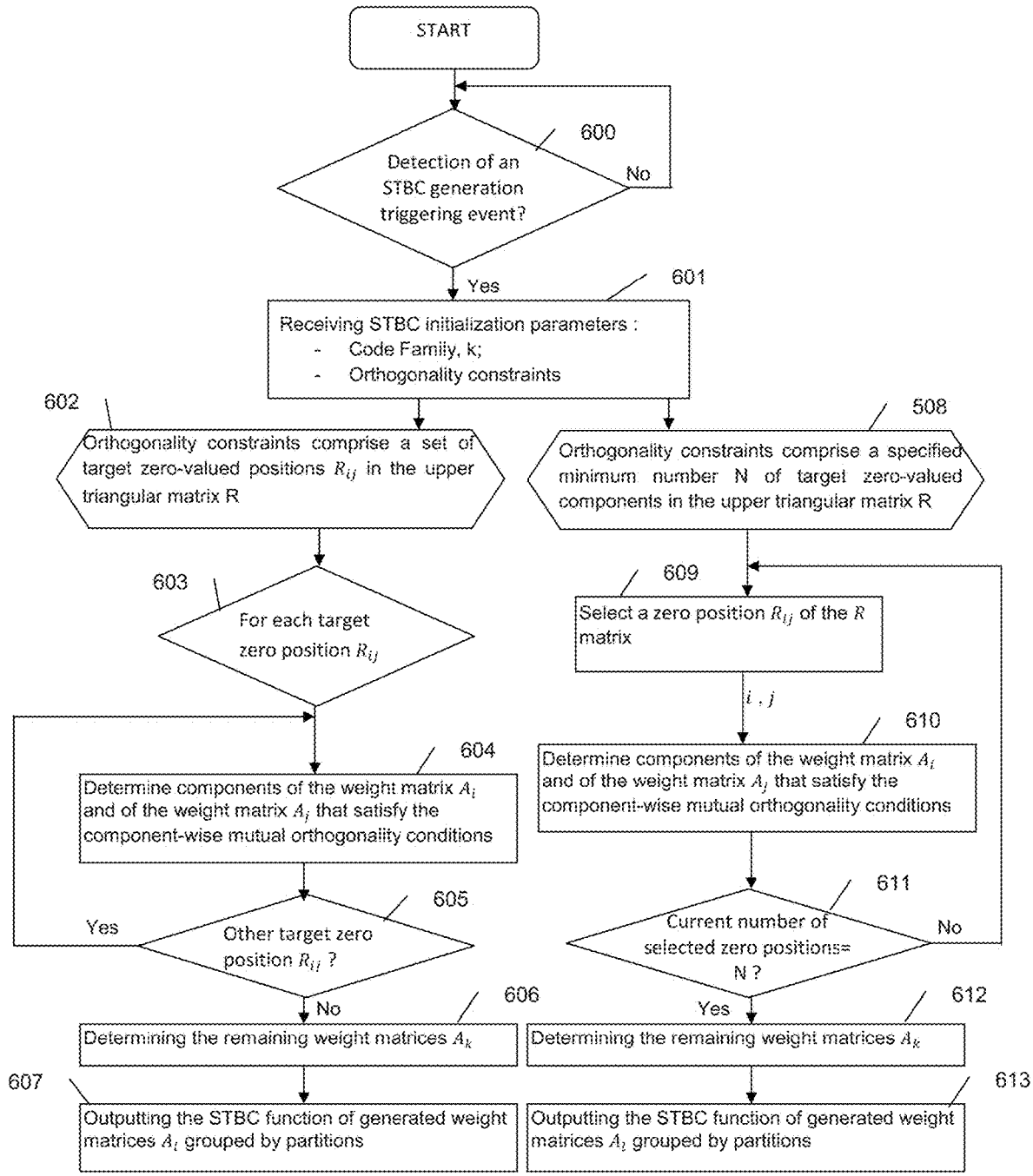
FIG. 6 is a flowchart depicting a space-time code generation method according to certain embodiments applying orthogonality constraints related to target zero-valued configurations of the upper triangular matrix.

FIG. 6 is a flowchart illustrating the STBC generation method according to an embodiment in which the orthogonality constraints comprise a target zero-valued component configuration of the upper triangular matrix R. The target zero-valued component configuration of the upper triangular matrix R may comprise:

a minimal number N of zeros-valued components in the upper triangular matrix R; and/or a set of zero-valued component positions in the triangular matrix R, noted $\{R_{ij}\}$ for N pairs (i,j) where i designates the row and j the column of the entry $R_{ij}$ in the R matrix where a zero value is desired.

In step 600, an STBC generation triggering event is detected.

In response to the detection of the STBC generation triggering event, a set of initialization parameters are retrieved in step 701. The initialization parameters may comprise at least one or more orthogonality constraints related to zero-valued positions in the R matrix (specified positions or number of positions).

The set of initialization parameters may also comprise target STBC parameters such as the target complexity under ML decoding, and/or the target diversity order, and/or the target coding rate. Alternatively the set of initialization parameters may comprise the specification of a given family of codes (Fast-Decodable codes, Multi-group decodable codes, etc.) which provides STBC target parameters. The following description of FIG. 6 will be made with reference to initialization parameters comprising a specified family of codes. The generated STBC will thus belong to the specified family so that at the receiver, the decoding may be made by group of symbols.

In addition, the set of initialization parameters may comprise a predefined or predetermined number of weight matrices associated with the STBC code (for example, for full rate codes, there are $n_tT$ matrices).

If the orthogonality constraints comprise the designation of a set of positions $\{R_{ij}\}$ of the upper triangular matrix which are to be associated with a zero value (i.e. $R_{ij}=0$), with i designating the $i^{th}$ row and j designating the $j^{th}$ column of the equivalent upper triangular matrix R (step 602), an STBC comprising k independent complex symbols and 2k weight matrices $A_l$ (each weight matrix $A_l$ comprising $n_t$ rows and T columns, where T represents the length of the STBC) is generated such that, for each target zero-valued position $R_{ij}$ of the matrix R (step 603), components $a_{ql}^{(i)}$ of the weight matrix $A_l$ and the components $a_{pl}^{(j)}$ of the weight matrix $A_j$, are determined so as to satisfy the component-wise mutual orthogonality conditions according to condition 22 or 23 (i.e. individual trace forms for $$a_{ql}^{(i)}\left(a_{pl}^{(j)}\right)^* \text{ or } ia_{ql}^{(i)}\left(a_{pl}^{(j)}\right)^*$$

equal to zero), where i and j designate the row and the column associated with the specified position $R_{ij}$ of the triangular matrix R (step 604). This step of determining component-wise mutual orthogonal weight matrices is iterated for each other specified zero-valued position $R_{ij}$ (605).

If it is determined that all the specified target zero-valued position $R_{ij}$ have been processed (605), the remaining weight matrices $A_k$ that have not yet been generated (hence for k different from the row and columns associated with a target zero-valued position $R_{ij}$ as specified in the orthogonal constraint) may be determined either arbitrarily or according to a filling method taking into account additional constraints and/or the previously generated weight matrices.

In step 606, an STBC code constructed from the generated weight matrices is output, for example to encode the modulated symbols. Accordingly, the STBC thus generated satisfies the predefined target parameters and ensures that the specified positions $R_{ij}$ of the matrix R are associated with a zero value.

Alternatively, if the orthogonality constraint specifies a minimal number N of zero-valued positions in the triangular matrix R (608), a first position $R_{ij}$ of the triangular matrix R may be selected (arbitrarily or according to a predefined selection method) in step 609, and the selected pair may be processed according to step 610 similarly to step 604 (i.e. components $a_{ql}^{(i)}$ of the weight matrix $A_i$ and the components $a_{pl}^{(j)}$ of the weight matrix $A_j$, are determined to satisfy the component-wise mutual orthogonality conditions according to condition 22 and/or 23). Selection step 609 is repeated for selecting a next position of the triangular matrix R and step 610 is iterated for the newly selected position. The same process is iterated until a number of positions of the triangular matrix R corresponding to the target number N has been processed (611).

Similarly to step 606, the remaining weight matrices $A_k$ that have not yet been generated may be determined.

In step 613, the STBC code associated from the generated weight matrices is output (to an STBC encoder for example). The STBC thus generated ensures that the triangular matrix R comprises a minimal number of zero valued positions.

Accordingly, the STBC generation method allows to accurately configure the zero configuration of the R matrix. For example it is possible to generate the STBC code to obtain zero-block patterns in the R matrix.

Figure 7:
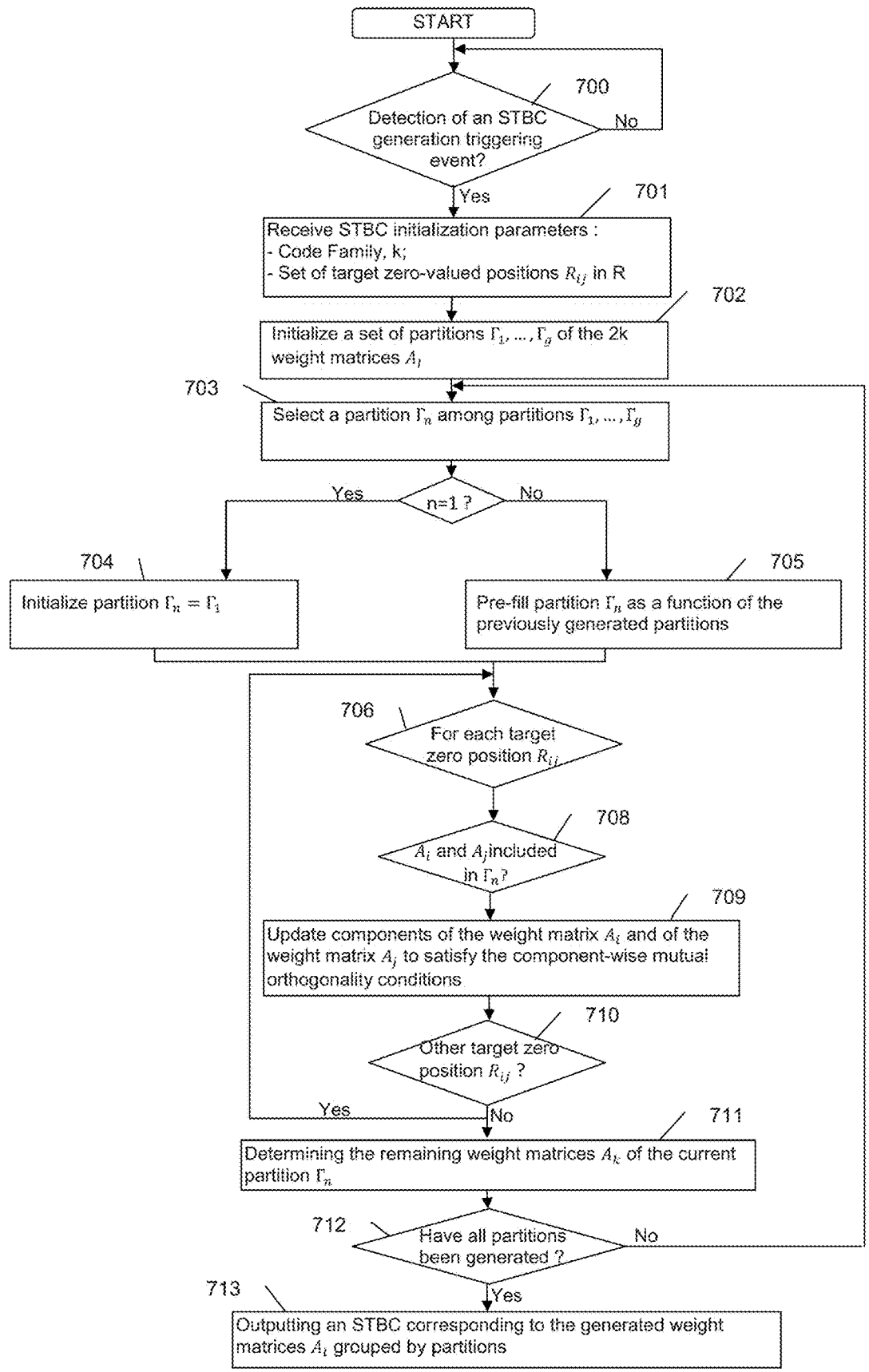
FIG. 7 is a flowchart depicting a space-time code generation method according to a progressive embodiment.

FIG. 7 is a flowchart illustrating the STBC generation method according to a progressive embodiment. According to the progressive embodiment, the weight matrices may be built recursively two-by-two or group-by-group so as to satisfy the target zero configuration of the R matrix. Even if not limited to such applications, the progressive embodiment is particularly suitable for constructing a STBC that belong to a desired family of code group such as the fast and the fast-group decodable group.

The STBC generation method according to the progressive embodiment may apply to any specified orthogonality constraint either expressed as a condition related to the orthogonality of pairs of column vectors of the equivalent matrix channel (specified pairs or minimal number of orthogonal pairs) or expressed as a target zero-valued component configuration of the upper triangular matrix R (specified positions or minimal number of zero position).

The following description of FIG. 7 will be made with reference to orthogonality constraints received in the form of a set of target zero-valued component configurations of the upper triangular matrix R for illustrative purpose only (set of zero-valued component positions in the triangular matrix R, noted $\{R_{ij}\}$ where i designates the row and j the column of the entry $R_{ij}$ in the R matrix where a zero value is desired).

In step 700, an STBC generation triggering event is detected.

In response to the detection of the STBC generation triggering event, a set of initialization parameters are retrieved in step 701. The initialization parameters may comprise at least one or more orthogonality constraints related to zero-valued positions in the R matrix (specified positions or number of positions).

The set of initialization parameters may also comprise target STBC parameters such as the target complexity under ML decoding, and/or the target diversity order, and/or the target coding rate. Alternatively the set of initialization parameters may comprise the specification of a given family of codes (Fast-Decodable codes, Multi-group decodable codes, etc.) which provides STBC target parameters. The following description of FIG. 7 will be made with reference to initialization parameters comprising a specified family of codes. The generated STBC will thus belong to the specified family of low-complexity ML decodable codes. Therefore, at the receiver, the decoding may be made by group of symbols.

In addition, the set of initialization parameters may comprise a predefined or predetermined number of weight matrices associated with the STBC code (for example, for full rate codes, there are $n_tT$ matrices).

In step 702, a partition $\Gamma_1, \ldots, \Gamma_g$ of the weight matrices is predefined (disjoint groups, each group comprising a set of weight matrices). The partition may be initialized based on the specified family of low-complexity ML decodable codes. The partitions are further initialized taking into account the target number of matrices specified in the initialization parameters. Particularly, the total number of weight matrices comprised in the partition may be equal to the target number of weight matrices specified in the initialization parameters. Each weight matrix, as initialized, may be empty or filled with pre-selected starting values.

In step 703, a partition $\Gamma_n$ is selected. Each selected partition $\Gamma_n$ may be initialized from the previously generated partitions in step 705, except for the first selected partition.

The first selected partition may be initially filled arbitrarily in step 704 or with selected starting values.

In step 708, the components of the weight matrices of the selected partition $\Gamma_n$ are modified to satisfy the component-wise mutual orthogonality criterion for each target zero-position $R_{ij}$ in the triangular matrix R (step 706), similarly to step 604, if:

at least one of the weight matrices $A_i$ and $A_j$ belong to the partition $\Gamma_n$, and the other weight matrix ($A_i$ or $A_j$) belongs to the partition $\Gamma_n$ or to one of the previously generated partition.

In step 709, the remaining partitions $A_k$ are filled (with k different from the i and j indexes of the target positions $R_{ij}$). Alternatively, if the initialization of the partitions in step 702 comprises a starting filling of the partitions, step 709 may be removed.

Steps 708 and 709 are repeated for each other specified zero-valued position $R_{ij}$ (710), for the currently selected partition $\Gamma_n$.

If it is determined that all the specified target zero-valued position $R_{ij}$ have been processed (605), the remaining weight matrices $A_k$ of the selected partition $\Gamma_n$ that have not yet been generated (hence for k different from the row and columns associated with a target zero-valued position $R_{ij}$ as specified in the orthogonal constraint) may be determined, in step 711, either arbitrarily or according to a filling method taking into account additional constraints and/or the previously generated weight matrices of the currently selected partition $\Gamma_n$ or the previously generated partitions.

The STBC generation method according to the progressive approach may alternatively be applied to generate an improved STBC satisfying target constraints from an existing code. In such embodiment, an original STBC code is received in step 701 and in step 702, the partitions are initialized from the partitions associated with the STBC if the STBC belongs to a family of code (multi-group, fast decodable, fast-group decodable, block orthogonal codes). Step 709 may be removed as the remaining partitions are filled with the data of the original STBC or replaced by updating the remaining partitions pre-filled with the data of the original STBC.

If not all the partitions have been generated (step 712), a next partition $\Gamma_n$ is selected (703) and determined from the previously generated partitions and to satisfy the component-wise mutual orthogonality criterion for each target zero-position $R_{ij}$ in the triangular matrix R.

Steps 703 to 712 are recursively iterated for each partition among $\Gamma_1, \ldots, \Gamma_K$ that is to be generated (selected in step 703) until all partitions are generated. The STBC code corresponding to the generated partitions is then output. It ensures that the R matrix has the target zero configuration (target zero-valued position $R_{ij}$ or minimal number of zero) while providing a partition that satisfies the target code family.

According to another embodiment, referred to hereinafter as an Algebraic embodiment, an STBC code may be generated from initial parameters and using a selected algebra such as the Cyclic Division Algebra.

Figure 8:
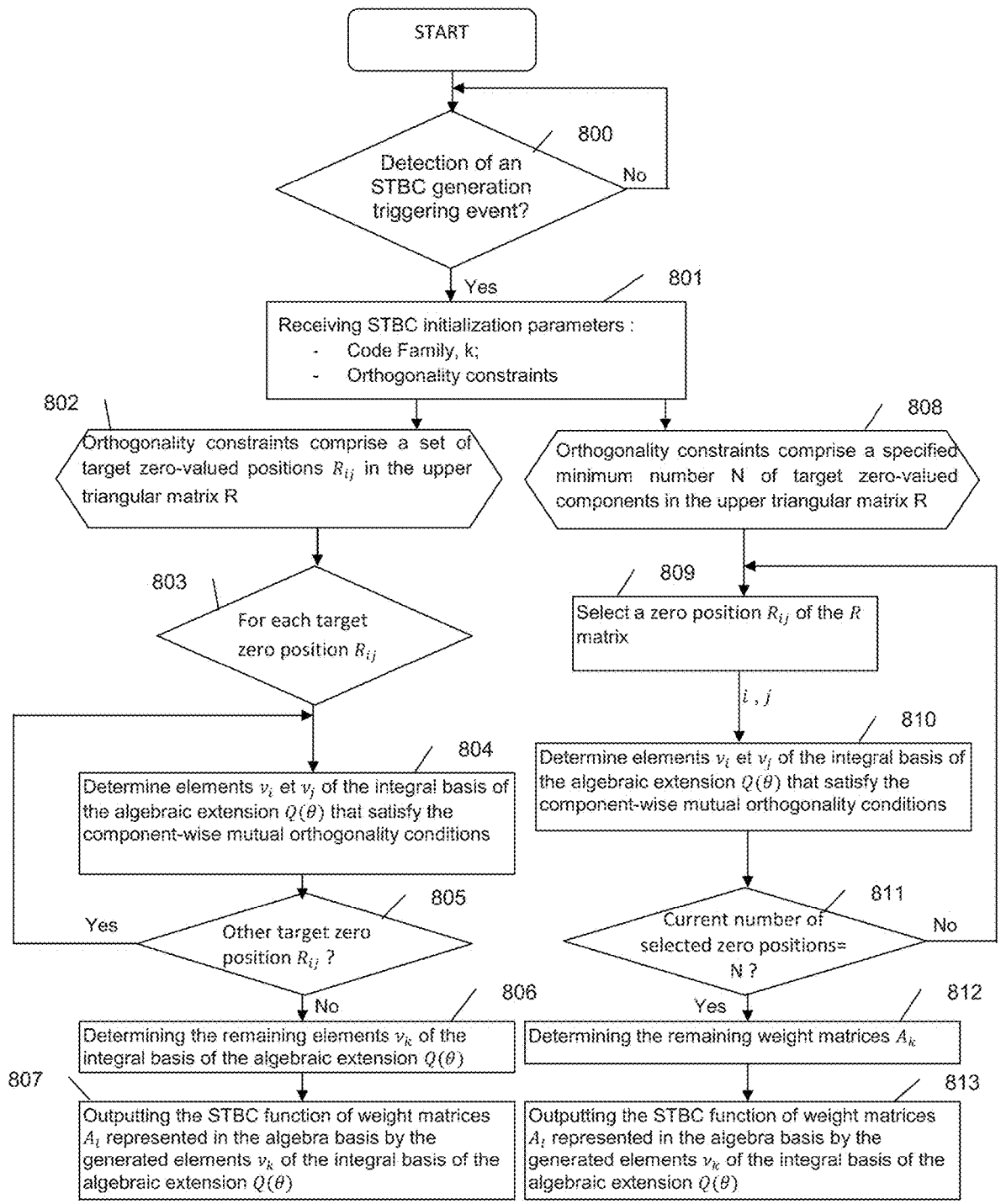
FIG. 8 is a flowchart depicting a space-time code generation method according to an algebraic embodiment.

FIG. 8 is a flowchart illustrating the STBC generation method according to an algebraic embodiment.

According to the Algebraic embodiment, the weight matrices may be represented by matrix representations, in the basis of the Algebra, of the elements of the integral basis of the algebraic number field $Q(\theta)$ used to construct the algebra. The space time codeword matrix X can be thus written as a function of the Algebra basis.

By noting $B_\mathcal{A}$ the Algebra basis, and $$B_I = \{v_i\}_{i=1,\ldots,n_t^2},$$

the integral basis of the algebraic number field used to construct the algebra, with $v_i$ representing the elements of the integral basis, the weight matrices $A_l$ can be written as a function of the integral basis as a function of the elements $v_i$ and the Algebra basis $B_\mathcal{A}$. Specifically, a weight matrix $A_l$ may be written as a function of an element $v_{l'}$ in the algebra basis. In certain applications, $A_{2(n_t^{k+j})}$ and $A_{2(n_t^{k+j})-1}$ are a function of element $v_{l'}$. In the following description of FIGS. 8 and 9, the element of the integral basis of the algebraic number field $Q(\theta)$ corresponding to a weight matrix $A_l$ will be noted $v_{l'}$, with l' representing the index of the element of the integral basis corresponding to the index of the weight matrix $A_l$.

The STBC generation method according to the algebraic embodiment may be applied to generate an STBC for any specified orthogonality constraint comprising either a condition related to the orthogonality of pairs of column vectors of the equivalent matrix channel (specified pairs or minimal number of orthogonal pairs) or a condition related to a target zero-valued component configuration of the upper triangular matrix R (specified positions or minimal number of zero position). The following description of FIG. 8 will be made with reference to orthogonality constraints related to target zero-valued component configurations of the upper triangular matrix R for illustrative purpose only (set of positions $\{R_{ij}\}$, with i designating the row and j the column of the entry $R_{ij}$ in the R matrix where a zero value is desired, or minimal number of zero-valued positions in the R matrix).

In step 800, an STBC generation triggering event is detected.

In response to the detection of the STBC generation triggering event, a set of initialization parameters, comprising a set of target zero-valued component configurations $\{R_{ij}\}$, are retrieved in step 801 (similarly to step 701 of FIG. 7). The initialization parameters may comprise at least one or more orthogonality constraints related to zero-valued positions in the R matrix (specified positions or number of positions). The set of initialization parameters may also comprise target STBC parameters (target complexity under ML decoding, and/or the target diversity order, and/or the target coding rate, and/or target family of codes and/or number of weight matrices). Step 801 further comprises the selection of the base field.

If the orthogonality constraints comprise a set of positions $\{R_{ij}\}$ of the upper triangular matrix which are to be associated with a zero value (i. e. $R_{ij}=0$), with i designating the $i^{th}$ row and j designating the $j^{th}$ column of the equivalent upper triangular matrix R (step 802), an STBC comprising k independent complex symbols and 2k weight matrices $A_l$ (each weight matrix $A_l$ comprising $n_t$ rows and T columns, where T represents the length of the STBC), the weight matrices being represented by matrix representations, in the basis of the Algebra, of the elements of the integral basis of the algebraic number field $Q(\theta)$ used to construct the algebra such that, for each target zero-position $R_{ij}$ (step 401), the elements $v_{i'}$ et $v_{j'}$ of the integral basis of the algebraic number field $Q(\theta)$, corresponding respectively to $A_i$ and $A_j$, satisfy the component-wise mutual orthogonality criterion, that is the individual trace forms for $$v_{ql}^{(i\prime)}\left(v_{pl}^{(j\prime)}\right)^* \text{ and/or } iv_{ql}^{(i\prime)}\left(v_{pl}^{(j\prime)}\right)^*$$

equal to zero, according to formulas 22 and 23 (step 804). This step of determining weight matrices by applying the component-wise mutual orthogonal is iterated for each other specified zero-valued position $R_{ij}$ (605).

If it is determined that all the specified target zero-valued positions $R_{ij}$ have been processed (805), the remaining weight matrices $A_k$ that have not yet been generated (hence for k different from the row and columns associated with a target zero-valued position $R_{ij}$ as specified in the orthogonal constraint) may be determined either arbitrarily or according to a filling method taking into account additional constraints and/or the previously generated weight matrices.

In step 806, an STBC code constructed from the generated weight matrices is output, for example to encode the modulated symbols. Accordingly, the STBC thus generated satisfies the predefined target parameters and ensures that the specified positions $R_{ij}$ of the matrix R are associated with a zero value.

Alternatively, if the orthogonality constraint specifies a minimal number N of zero-valued positions in the triangular matrix R (808), a first position $R_{ij}$ of the triangular matrix R may be selected (arbitrarily or according to a predefined selection method) in step 809, and the selected pair may be processed according to step 810 similarly to step 804 (i.e. the corresponding elements $v_{i'}$ et $v_{j'}$ of the integral basis of the algebraic number field $Q(\theta)$ are determined to satisfy the component-wise mutual orthogonality criterion (individual trace forms for $$v_{ql}^{(in)}(v_{pl}^{(jn)})^* \text{ and/or } iv_{ql}^{(in)}(v_{pl}^{(jn)})^*$$

equal to zero). Selection step 809 is repeated for selecting a next position of the triangular matrix R and step 810 is iterated for the newly selected position. The same process is iterated until a number of positions of the triangular matrix R corresponding to the target number N has been processed (811).

Similarly to step 806, the remaining elements $v_{k'}$ of the integral basis of the algebraic number field $Q(\theta)$ that have not yet been generated and that represent the weight matrices $A_k$ may be determined.

In step 813, the STBC associated with the weight matrices represented by the elements $v_k$ of the integral basis of the algebraic number field $Q(\theta)$ is output (to an STBC encoder for example). The STBC thus generated ensures that the triangular matrix R comprises a minimal number of zero valued positions.

In yet another embodiment (hybrid embodiment), the progressive and algebraic approaches may be combined such that weight matrices (in algebraic representation) of at least one of the partitions are constructed using the progressive approach and weight matrices of at least one of the partitions are built algebraically.

Figure 9:
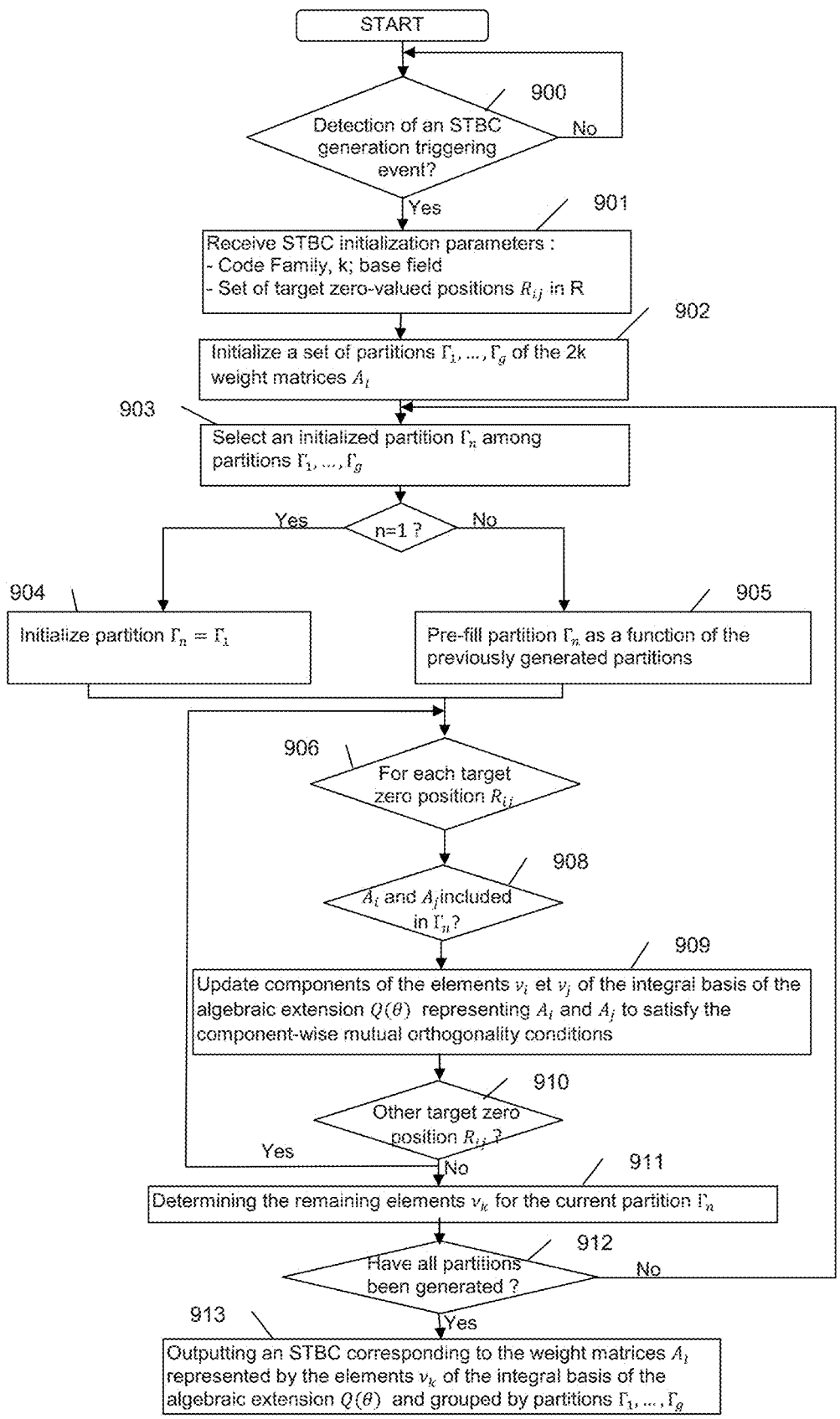
FIG. 9 is a flowchart depicting a space-time code generation method according to a hybrid embodiment.

FIG. 9 is a flowchart illustrating the STBC generation method according to a hybrid embodiment.

Steps 900 to 913 are substantially similar to steps 700 to 713 of FIG. 7, but instead of applying the component-wise mutual criterion to determine the components of the weight matrices (step 709 of FIG. 7), in step 909 the component-wise mutual criterion is applied to the elements $v_i$, $v_j$, corresponding respectively to $A_i$ and $A_j$, of the integral basis of the algebraic number field $Q(\theta)$ used to construct the Algebra similarly to step 804 of FIG. 8. Further, step 912 differs from step 712 in that instead of determining the remaining weight matrices $A_k$ of the current partition, step 912 comprises determining the remaining elements $v_k$, of the integral basis of the algebraic number field $Q(\theta)$ used to construct the Algebra, for the current partition (not yet generated as a result of the application of the component-wise mutual criterion to determine the components of the weight matrices).

Accordingly, the STBC generation method allows to accurately configure the zero configuration of the R matrix. For example it is possible to generate the STBC code to obtain zero-block patterns in the R matrix. Zero entries of the matrix R lead to faster metric computations in the relevant Sequential Decoding branches, generating a lower computational complexity for returning the ML solution. By controlling the zero configuration of the upper triangular matrix, the invention thus makes it possible to optimize the computational complexity.

It is thus an advantage of the invention to generate codes that ensure a complexity reduction and better performance in the sense of the minimization of the error propagation.

The zero structure of the matrix R obtained from the QR decomposition of the equivalent channel matrix may be thus exploited in order to perform reduced-complexity decoding.

Even if not limited to such application, the invention is particularly adapted to block decoding by division of the matrix R.

It has been observed that the Fast Sphere Decoding complexity of the linear STBCs generated according to certain embodiments depends only on the weight matrices and their ordering and not on the channel matrix or the number of receive antennas.

The application of the code generation method based on the component-wise mutual orthogonality criteria provides the maximum guaranteed number of columns in the equivalent channel matrix that can be orthogonal. This may be illustrated by verifying the component-wise mutual orthogonality criteria on exemplary Perfect codes and by the resulting structure of the matrix R corresponding to a coded MIMO system.

Perfect codes represent codes built using Cyclic Division Algebra with full diversity, full rate and satisfying non-vanishing determinant property with $n_t=n_r=T$ and $k=n_t^2$. The codebooks construction starts with the selection of the base field.

Let $F=\mathbb{Q}(i)$ be a number field of dimension 2 having as basis $B_F=(1,i)$ and embedding $\tau$ such that for any $\lambda \in F$, $\lambda=\lambda_0+\lambda_1 i$, with $\lambda_0$ and $\lambda_1 \in \mathbb{Q}$:

$$\tau(\lambda)=\lambda_0-\lambda_1 i, \text{ with } \tau \text{ coinciding with the complex conjugation of } \lambda.$$

For QAM information symbols, a base field $F=\mathbb{Q}(i)$ may be considered. Further, a number field $\mathbb{Q}(\theta)$ of degree $n_t$ is being considered, the extension of $\mathbb{Q}$ having as integral basis $B_I=\{v_k\}_{k=1,\ldots,n_t}$ and embedding $\sigma$ such that $\sigma(\theta)=\bar{\theta}$.

A corresponding generator matrix $M \in \mathbb{C}^{n_t \times n_t}$ can be obtained by embedding the basis $B_I$ according to:

$$M = \begin{bmatrix} - & B_I & - \\ - & \sigma(B_I) & - \\ \vdots & \vdots & \vdots \\ - & \sigma^{n_t-1}(B_I) & - \end{bmatrix}$$

In a subsequent step, $K=\mathbb{Q}(i,\theta)$ is defined to be the compositum of F and $\mathbb{Q}(\theta)$. K represents a Galois extension of F of degree $n_t$. The embedding $\{\sigma_k\}_{k=1,\ldots,n_t}$ defines the Galois group Gal(K/F) of generator $\sigma$. Hence, for all $k=1,\ldots,n_t-1$, $\sigma_k=\sigma^k$. Using these elements, the corresponding Cyclic Division Algebra $\mathcal{A}=(K/F,\sigma,k)$ of degree $n_t$ is defined such that:

$$\mathcal{A}=1 \cdot K \oplus e \cdot K \oplus \ldots \oplus e^{n_t-1} \cdot K$$

with $e \in \mathcal{A}$ such that for all $x \in K$, the non-commutativity property $x \cdot E=e.\sigma(x)$ is satisfied and $e^{n_t}=\gamma \in F\setminus\{0_F\}$ and $\gamma$ is not a norm. Space-Time Codebooks constructed using Cyclic Division Algebra consist of a finite subset of the underlying algebra $\mathcal{A}$, codewords can accordingly be written in the form:

$$X = \begin{bmatrix} \sum_{i=1}^{n_t} s_i v_i & \sum_{i=n_t+1}^{2n_t} s_i v_i & \ldots & \sum_{i=3n_t+1}^{n_t^2} s_i v_i \\ \gamma\sigma\left(\sum_{i=3n_t+1}^{n_t^2} s_i v_i\right) & \sigma\left(\sum_{i=1}^{n_t} s_i v_i\right) & \ldots & \sigma\left(\sum_{i=2n_t+1}^{3n_t} s_i v_i\right) \\ \vdots & \vdots & \ddots & \vdots \\ \gamma\sigma^{n_t-1}\left(\sum_{i=n_t+1}^{2n_t} s_i v_i\right) & \gamma\sigma^{n_t-1}\left(\sum_{i=2n_t+1}^{3n_t} s_i v_i\right) & \ldots & \sigma^{n_t-1}\left(\sum_{i=1}^{n_t} s_i v_i\right) \end{bmatrix}$$

where $s_i$ with $i,j=1, \ldots, n_t^2$ denotes the $n_t^2$ information symbols depicted from a QAM constellation. $B_{\mathcal{A}} = (I_{n_t}, e, \ldots, e^{n_t-1})$ being a basis of the algebra, codewords can also be written in the form:

$$X = \text{diag}(Mx_0) \cdot I_{n_t} + \text{diag}(Mx_1) \cdot e + \ldots + \text{diag}(Mx_{n_t-1})e^{n_t-1}$$

The elements $x_k$ with $k=1, \ldots, (n_t-1)$ represent column vectors of dimension $n_t$ composed of the $n_t^2$ information symbols and diag(u) is a diagonal matrix with a diagonal vector u. As Perfect codes are linear LD codes, they admit an LD representation.

Weight matrices may be then written as functions of the basis $B_{\bar{I}} = \{v_k\}_{k=1, \ldots, n_t^2}$ and the basis $B_{\mathcal{A}}$ according to:

$$A_{2(n_t^k+j)-1} = \text{diag}(\mathcal{V}_{1,j})e^k$$

$$A_{2(n_t^k+j)} = i \cdot \text{diag}(\mathcal{V}_{1,j})e^k$$

For with $k=1, \ldots, (n_t-1)$ and $j=1, \ldots, n_t$ and where $\mathcal{V}_{1,j} = [v_j, \sigma(v_j), \ldots \sigma^{n_t-1}(v_j)]^t$ It should be noted that the weight matrices for the Perfect codes are partitioned into $n_t$ disjoint groups $\Gamma_{k\{k=1, \ldots, (n_t-1)\}}$. Each group may comprise $2n_t$ weight matrices. Weight matrices $(A_{2(n_t^k+j)-1}, A_{2(n_t^k+j)})_{\{j=1, \ldots, n_t\}}$ for the groups $\Gamma_{k\{k=1, \ldots, (n_t-1)\}}$ are related to the matrices $(A_{2j-1}, A_{2j})_{\{j=1, \ldots, n_t\}}$ in the group $\Gamma_0$ by the following relations:

$$A_{2(n_t^k+j)-1} = A_{2j-1}e^k$$

$$A_{2(n_t^k+j)} = A_{2j}e^k$$

For a Perfect STBC comprising $n_t^2$ independent complex information symbols, $2n_t^2$ weight matrices $A_l$ with $l=1, \ldots, 2n_t^2$, that belong to $n_t$ groups $\Gamma_k$ with $k=0, \ldots, (n_t-1)$, for $A_u$ and $A_v$ belonging to $\Gamma_k$, $k=0, \ldots, (n_t-1)$, and $u \neq v$, it has been shown that the following relation is satisfied:

if $(u+v) \bmod 2 = 1$, then $\langle h_u^{eq}, h_v^{eq} \rangle = 0$

A Golden Code will now be considered with $n_t = n_r = T = 2$.

The Golden code employs 2 transmit and 2 receive antennas and encodes 4 complex QAM symbols over two time slots (T=2) achieving full rate and full diversity. The codebook for this case is constructed using the base field $F = \mathbb{Q}(i)$ and $K = \mathbb{Q}(\theta)$ is an extension of $\mathbb{Q}(i)$ of degree 2. The generator of the Galois group of $K/\mathbb{Q}(i)$ is $\sigma$ such that:

$$\theta = \frac{1+\sqrt{5}}{2}, \sigma = \frac{1-\sqrt{5}}{2} = \bar{\theta}$$

The integral basis $B_{\bar{I}} = (v_1, v_2) = (\alpha, \alpha\theta)$ with $\alpha = 1 + i - i\theta$ and the generator matrix is given by:

$$M = \begin{bmatrix} \alpha & \alpha\theta \\ \bar{\alpha} & \bar{\alpha}\bar{\theta} \end{bmatrix}, \bar{\alpha} = 1 + i - i\bar{\theta}$$

The Golden code codeword matrix has then the form:

$$X = \text{diag}\left(M\begin{bmatrix} s_1 \\ s_2 \end{bmatrix}\right) \cdot I_2 + \text{diag}\left(M\begin{bmatrix} s_3 \\ s_4 \end{bmatrix}\right) \cdot e = \frac{1}{\sqrt{5}} \begin{bmatrix} \alpha(s_1 + \theta s_2) & \alpha(s_3 + \theta s_4) \\ \bar{\alpha}(s_3 + \bar{\theta} s_4) & \bar{\alpha}(s_1 + \bar{\theta} s_2) \end{bmatrix}$$

Further, $\gamma = i$, $$e = \begin{bmatrix} 0 & 1 \\ \gamma & 0 \end{bmatrix}$$

and $s_i$ with $i=1, \ldots, 4$ are the transmitted symbols taken from the $2^q$-QAM constellation. For the case of the Golden code, there are 2 groups for the LD matrices $\Gamma_0$ and $\Gamma_1$, and in each group there are 4 matrices as follows:

$\Gamma_0: A_1 = \text{diag}(v_1, \sigma(v_1)), A_2 = i\text{diag}(v_1, \sigma(v_1)), A_3 = \text{diag}(v_2, \sigma(v_2)), A_4 = i\text{diag}(v_2, \sigma(v_2))$ $\Gamma_1: A_5 = \text{diag}(v_1, \sigma(v_1))e, A_6 = i\text{diag}(v_1, \sigma(v_1))e, A_7 = \text{diag}(v_2, \sigma(v_2))e, A_8 = i\text{diag}(v_2, \sigma(v_2))e$ Applying the component-wise mutual orthogonality conditions 22 and 23 to the exemplary Golden code, this provides for group $\Gamma_0$:

$\{A_1, A_2\}$: $l=1$: $Tr(v_1(iv_1)^*) = Tr(v_1(0)^*) = Tr(0(iv_1)^*) = Tr(0(0)^*) = 0$ $l=2$: $Tr(0(0)^*) = Tr(0(\sigma(v_1))^*) = Tr(\sigma(v_1)(0)^*) = Tr(\sigma(v_1)(\sigma(v_1))^*) = 0$ $\{A_1, A_4\}$: $l=1$: $Tr(v_1(iv_2)^*) = Tr(v_1(0)^*) = Tr(0(iv_2)^*) = Tr(0(0)^*) = 0$ $l=2$: $Tr(0(0)^*) = Tr(0(\sigma(v_2))^*) = Tr(\sigma(v_1)(0)^*) = Tr(\sigma(v_1)(\sigma(v_2))^*) = 0$ $\{A_2, A_3\}$: $l=1$: $Tr(iv_1(v_2)^*) = Tr(iv_1(0)^*) = Tr(0(iv_2)^*) = Tr(0(0)^*) = 0$ $l=2$: $Tr(0(0)^*) = Tr(0(\sigma(v_2))^*) = Tr(\sigma(v_1)(0)^*) = Tr(\sigma(iv_1)(\sigma(v_2))^*) = 0$ $\{A_3, A_4\}$: $l=1$: $Tr(v_2(iv_2)^*) = Tr(v_2(0)^*) = Tr(0(iv_2)^*) = Tr(0(0)^*) = 0$ $l=2$: $Tr(0(0)^*) = Tr(0(\sigma(iv_2))^*) = Tr(\sigma(v_2)(0)^*) = Tr(\sigma(v_2)(\sigma(v_2))^*) = 0$ Applying the component-wise mutual orthogonality conditions 22 and 23 to the exemplary Golden code, this provides for group $\Gamma_1$:

$\{A_5, A_6\}$: $l = 1$: $Tr(0(0)^*) = Tr(0(\gamma i\sigma(\nu_1))^*) = Tr((\gamma\sigma(\nu_1)(0))^*) = Tr(|\gamma|^2\sigma(\nu_1)(i\sigma(\nu_1))^*) = 0$ $l = 2$: $Tr(\nu_1(i\nu_1)^*) = Tr(\nu_1(0)^*) = Tr(0(i\nu_1)^*) = Tr(0(0)^*) = 0$ $\{A_5, A_8\}$: $l = 1$: $Tr(0(0)^*) = Tr(0(\gamma i\sigma(\nu_2))^*) = Tr((\gamma\sigma(\nu_1)(0))^*) = Tr(|\gamma|^2\sigma(\nu_1)(i\sigma(\nu_2))^*) = 0$ $l = 2$: $Tr(\nu_1(i\nu_2)^*) = Tr(\nu_1(0)^*) = Tr(0(i\nu_1)^*) = Tr(0(0)^*) = 0$ $\{A_6, A_7\}$: $l = 1$: $Tr(0(0)^*) = Tr(0(\gamma\sigma(\nu_2))^*) = Tr((i\gamma\sigma(\nu_1)(0))^*) = Tr(|\gamma|^2\sigma(\nu_1)(i\sigma(\nu_2))^*) = 0$ $l = 2$: $Tr(i\nu_1(\nu_2)^*) = Tr(i\nu_1(0)^*) = Tr(0(\nu_2)^*) = Tr(0(0)^*) = 0$ $\{A_7, A_8\}$: $l = 1$: $Tr(0(0)^*) = Tr(0(\gamma i\sigma(\nu_2))^*) = Tr((\gamma\sigma(\nu_2)(0))^*) = Tr(|\gamma|^2\sigma(\nu_1)(i\sigma(\nu_2))^*) = 0$ $l = 2$: $Tr(\nu_2(i\nu_2)^*) = Tr(\nu_2(0)^*) = Tr(0(i\nu_2)^*) = Tr(0(0)^*) = 0$ Given the satisfied properties, the following zero entries of the matrix R are obtained:

$R: R_{12} = R_{14} = R_{23} = R_{34} = R_{56} = R_{58} = R_{67} = R_{78} = 0$

The structure of the R matrix is depicted in FIG. 10, which represents the upper triangular matrix R corresponding to this exemplary Golden code, with $n_t = n_r = 2 = T = 2$. White entries represents zeros valued components and grey entries represents non-zeros valued components.

Another example of a Perfect Code is considered ($n_t^2$ independent complex information symbols), with $n_t = n_r = T = 4$. For the 4-dimensional Perfect codes with $n_t = n_r = T = 4$, the system employs 4 transmit and 4 receive antennas and encodes 16 complex QAM symbols over 4 channel uses (T=2). The codebook for this case is constructed using the base field $F = \mathbb{Q}(i)$ and $K = \mathbb{Q}(i,\theta)$ with $$\theta = \xi_{15} + \xi_{15}^{-1} = 2\cos\left(\frac{2\pi}{15}\right) \text{ where } \xi_{15} = \exp\left(\frac{2i\pi}{15}\right)$$

is the $15^{th}$ root of unity. In this case $\alpha = 1$. The generator of the Galois group of $K/\mathbb{Q}(i)$ is $\sigma$ such that:

$\theta = \xi_{15}^2 + \xi_{15}^{-2}$

The integral basis $B_j = (\nu_1, \nu_2, \nu_3, \nu_4)$ is such that:

$\nu_1 = (1 - 3i) + \theta^2$ $\nu_2 = (1 - 3i)\theta + i\theta^3$ $\nu_3 = -i + (-+4i)\theta + (1-i)\theta^3$ $\nu_4 = (-1+i) - 3\theta + \theta^2 + \theta^3$ The generator matrix is given by:

$$M = \frac{1}{15}\begin{bmatrix} \nu_1 & \nu_2 & \nu_3 & \nu_4 \\ \sigma(\nu_1) & \sigma(\nu_2) & \sigma(\nu_3) & \sigma(\nu_4) \\ \sigma^2(\nu_1) & \sigma^2(\nu_2) & \sigma^2(\nu_3) & \sigma^2(\nu_4) \\ \sigma^3(\nu_1) & \sigma^3(\nu_2) & \sigma^3(\nu_3) & \sigma^3(\nu_4) \end{bmatrix}$$

The codeword matrix for the 4*4 Perfect Code has the form:

$X = \text{diag}(Mx_1)I_4 + \text{diag}(Mx_2)e + \text{diag}(Mx_3)e^2 + \text{diag}(Mx_4)e^3 =$ $$\begin{bmatrix} \sum_{i=1}^{4} s_i\nu_i & \sum_{i=5}^{8} s_i\nu_i & \sum_{i=9}^{12} s_{n_t,i}\nu_i & \sum_{i=13}^{16} s_{n_t,i}\nu_i \\ \gamma\sigma\left(\sum_{i=13}^{16} s_i\nu_i\right) & \sigma\left(\sum_{i=1}^{4} s_i\nu_i\right) & \sigma\left(\sum_{i=5}^{8} s_i\nu_i\right) & \sigma\left(\sum_{i=9}^{12} s_i\nu_i\right) \\ \gamma\sigma^2\left(\sum_{i=9}^{12} s_i\nu_i\right) & \gamma\sigma^2\left(\sum_{i=13}^{16} s_i\nu_i\right) & \sigma^2\left(\sum_{i=5}^{1} s_4\nu_i\right) & \sigma^2\left(\sum_{i=5}^{8} s_i\nu_i\right) \\ \gamma\sigma^3\left(\sum_{i=5}^{8} s_i\nu_i\right) & \gamma\sigma^3\left(\sum_{i=9}^{12} s_i\nu_i\right) & \gamma\sigma^3\left(\sum_{i=13}^{16} s_i\nu_i\right) & \sum_{i=1}^{4} s_i\nu_i \end{bmatrix}$$

where the symbol vectors are given by:

$x_1 = [s_1, s_2, s_3, s_4]^t$ $x_2 = [s_5, s_6, s_7, s_8]^t$ $x_3 = [s_9, s_{10}, s_{11}, s_{12}]^t$ $x_4 = [s_{13}, s_{14}, s_{15}, s_{16}]^t$

Further:

$$e = \begin{bmatrix} 0 & 1 & 0 & 0 \\ 0 & 0 & 1 & 0 \\ 0 & 0 & 0 & 1 \\ \gamma & 0 & 0 & 0 \end{bmatrix}$$

For a 4×4 Perfect code, there are 4 groups for the LD matrices $\Gamma_0$, $\Gamma_1$, $\Gamma_2$, $\Gamma_3$, and in each group there are 8 matrices. Using the expressions of the weight matrices, the form of the matrix R is as represented in FIG. 11 (white entries represents zeros valued components and grey entries represents non-zeros valued components).

It should be noted that the zero structure of the matrix R depends only on the weight matrices and their ordering in the matrix G which corresponds to the ordering of the real and imaginary parts of the complex information symbols in the vector $\tilde{s}$. Any changing in this ordering impacts the number and locations of zero entries in the matrix R.

Considering a permutation matrix $P_s$ that allows to change the ordering of the elements in $\tilde{s}$ applied to $\tilde{s}$ and similarly $P_y$ a permutation matrix applied to $\vec{vec}(Y)$ and $\vec{vec}(Z)$, the permutation matrices being orthogonal, it has been analyzed that for $P_s = P_y$:

for Intra-block permutation, i.e. when the permutation matrix Ps applies a same permutation inside each of the blocks $\Gamma_k$ (partition), with k=1, ..., $n_r$-1, the corresponding zero entries in the R matrix undergo a permutation in positions in rows and columns but remain inside the same block in the matrix R. This type of permutation changes only the location of the zero entries inside the blocks in same way but keeps the number of zeros the same as without applying permutation. Two examples of such permutation are depicted in FIGS. 12 and 13 for the Golden Code ($n_t=n_r=T=2$). FIG. 12 corresponds to a same permutation being applied in each of the blocks $\Gamma_k$ and allows to obtain the Fast Sphere Decodability form for the Golden Code. FIG. 13 corresponds to different permutations being applied in each block.

For Inter-block permutation, i.e. when the permutation matrix $P_s$ changes the ordering of the weight matrices between or inter the blocks $\Gamma_k$, with k=1, ..., $n_r$-1, the corresponding zeros entries in the R matrix undergo an arbitrary changing in the positions and may coincide with the lower part of the matrix R which already contain only zero entries. This type of permutation may not keep thus the maximum number of zero as without permutation and may capture zero entries in the upper part of the matrix R corresponding to blocks $\Gamma_k$ and $\Gamma_{k'}$, such that k # k'. An example of the R matrix obtained using an inter-block permutation is represented in FIG. 14 (for the Golden Code ($n_t=n_r=T=2$)).

Although the description of the above embodiments have been made mainly in relation with a STBC code generation device and method implemented in a transmitter, in another application of the invention, the novel component-wise mutual orthogonality criteria may also be implemented in the receiver side for any linear Space Time Block code used to encode the data stream in the transmit side. In particular, the invention may apply to complexity determination devices or methods, implemented in a receiver comprising a sequential decoder, the complexity determination devices or methods applying the novel component-wise mutual orthogonality conditions to determine the required ML decoding complexity of the given STBC linear code. In still another application of the invention, the transmitter-receiver system may implement the novel component-wise mutual orthogonality conditions to adapt the coding scheme as function of the available computational resources at receiver devices.

The methods provided in the present invention may be implemented in a computer program, software, or firmware tangibly embodied in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

While embodiments of the invention have been illustrated by a description of various examples, and while these embodiments have been described in considerable detail, it is not the intent of the applicant to restrict or in any way limit the scope of the appended claims to such details. Particularly, the invention is not limited to a particular type of tree-search based decoder. Further, the invention is not limited to the set of initialization parameters or to the particular types of STBC generation triggering events, mentioned in relation with certain embodiments. Also, in algebraic or hybrid embodiments, the invention may apply to different types of algebras.

Further, while some embodiments of the invention have been described in relation to wireless MIMO systems involving a single pair of transmitter/receiver, it should be noted that the invention is not limited to such an application. The invention may be integrated in any receiver device operating in any linear communication system characterized by a linear representation of the channel output. The communication system may be wired, wireless or optical fiber-based accommodating single or multiple users, using single or multiple antennas, and single or multi-carrier communication techniques. For example, the present invention may be integrated in a receiver device implemented in a wireless distributed MIMO system. Distributed MIMO may be used for example in cellular communications applied in 3G, 4G, LTE, and future 5G standard. Cooperative communications applied for example in ad-hoc networks (wireless sensor networks, machine-to-machine communications, internet of things, etc) are also examples of distributed MIMO systems. In addition to wireless networks, the present invention may be integrated in optical receiver devices implemented in optical fiber-based communication systems such as Polarization Division Multiplexing-OFDM (PDM-OFDM) systems.

Further, the invention is not limited to communication devices and may be integrated in signal processing devices such as electronic filters of finite impulse response (FIR) used in audio applications like audio crossovers and audio mastering. Accordingly, some embodiments may be used to determine an estimate of an input sequence, given an output sequence of a FIR filter of order M.

In another application, methods, devices and computer program products according to some embodiments of the invention may be implemented in a Global Navigation Satellite System (GNSS), such as IRNSS, Beidou, GLONASS, Galileo; GPS comprising for instance at least a GPS receiver for estimating positioning parameters using for example carrier phase measurements.

Further, methods, devices and computer program products according to some embodiments of the invention may be implemented in cryptographic systems for determining estimates on private secret values used in a cryptographic algorithm for encrypting/decrypting data or messages during their storage, processing or communication. In lattice-based cryptography applications, data/messages are encrypted in the form of lattice points. The decryption of such encrypted data may be advantageously performed according to some embodiments of the invention, enabling for a high probability of success recovery of secret values with a reduced complexity.

The invention claimed is:

1. A method, performed by an apparatus, for encoding digital data, comprising:
   modulating the digital data received from an information source;
   generating a space-time block code (STBC) for encoding the modulated digital data, wherein the space-time block code being represented by a set of linear dispersion matrices in a linear dispersion representation, each linear dispersion matrix comprising components having complex values;

generating at least some of the linear dispersion matrices depending on component-wise conditions related to a set of selected pairs of said linear dispersion matrices, each pair comprising a first linear dispersion matrix and a second linear dispersion matrix, said component-wise conditions comprising a component-wise condition between the components of the first linear dispersion matrix and the components of the second linear dispersion matrix, said component-wise condition depending, for each column of the linear dispersion matrices, on at least one of the real dimensions of the product between a component of the first linear dispersion matrix and the complex conjugate of a component of the second linear dispersion matrix, and wherein said component-wise condition is satisfied if said at least one real dimension of said product is null, for each column of the linear dispersion matrices; and generating the encoded modulated digital data based on the generated space-time block code for transmission through a transmission channel to be received by a digital data receiver.

2. The method of claim 1, wherein each linear dispersion matrix is represented by a matrix element, and wherein said component-wise condition depends, for each column of the linear dispersion matrices, on at least one of the real dimensions of trace form of the product between a component of the matrix element representing the first linear dispersion matrix and the complex conjugate of a component of the matrix element representing the second linear dispersion matrix, and wherein said component-wise condition is satisfied if said at least one real dimension of the trace form of the product is null, for each column of the linear dispersion matrices.

3. The method of claim 2, wherein the linear dispersion matrices are represented by matrix representations, in the basis of a given Algebra, said matrix elements corresponding to the elements of the integral basis of the number field used to construct the code.

4. The method of claim 1, wherein the transmission channel is represented by an equivalent channel matrix, the method comprising generating the space-time block code, in response to at least one constraint identifying a set of pairs of position indexes related to the equivalent channel matrix, said generating the space-time block code comprising, for each pair of position indexes:
  a. selecting a pair of linear dispersion matrices such that the indexes of the two linear dispersion matrices of each pair corresponds to the position indexes of said pair of position indexes,
  b. determining the components of the linear dispersion matrices of said selected pair so that said selected pair of linear dispersion matrices satisfies said component-wise condition.

5. The method of claim 4, wherein said constraint comprises an orthogonality constraint related to a set of orthogonal pairs of column vectors of the equivalent channel matrix, and wherein each pair of position indexes corresponds to the two column indexes of the column vectors of one of said pairs of column vectors of the equivalent channel matrix.

6. The method of claim 4, wherein said constraint comprises an orthogonality constraint related to a minimal number of orthogonal pairs of column vectors of the equivalent channel, the method comprising selecting a number of pairs of the column vectors of the equivalent channel matrix and wherein, each pair of position indexes corresponds to the two column indexes of the column vectors of one of said selected pair of column vectors of the equivalent channel matrix.

7. The method of claim 4, wherein the equivalent channel matrix is associated with an upper triangular matrix R obtained from a QR decomposition of the equivalent channel matrix and said constraint comprises an orthogonality constraint related to at least one target zero-valued position of the upper triangular matrix R, each target zero valued-position being defined by a pair of indexes comprising a line index and a column index, and wherein each pair of position indexes corresponds to the pair of indexes of one of said target zero-valued positions.

8. The method of claim 4, wherein the equivalent channel matrix is associated with an upper triangular matrix R obtained from the QR decomposition of the equivalent channel matrix and said constraint comprises an orthogonality constraint related to a minimal number of target zero-valued position of the upper triangular matrix R, the method comprising selecting a number of target zero-valued positions at least equal to said minimal number, each target zero-valued position being defined by a pair of indexes comprising a line index and a column index, and wherein each pair of position indexes corresponds to the pair of indexes of one of said target zero-valued positions.

9. The method of claim 1, wherein the method comprises initializing a partition of said set of the linear dispersion matrices into at least two disjoint groups, said generating at least some of the linear dispersion matrices comprising iteratively generating the linear dispersion matrices of a given partition based on the generated partitions.

10. The method of claim 9, wherein said partition depends on a predefined class of code.

11. The method of claim 10, wherein the class of code is one of the following classes of codes: multi-group decodable code class, fast decodable code class, fast-group decodable code class, block orthogonal code classes.

12. The method of claim 11, wherein the method comprises receiving an initial space time block code comprising a set of the linear dispersion matrices grouped by partitions, said initializing the partitions comprising defining said partitions from the partitions of the initial space time block code.

13. A device for encoding digital data, comprising:
a modulator configured to modulate the digital data received from an information source; and
a space-time block code (STBC) generator configured to:
  generate a space-time block code for encoding the modulated digital data, wherein the space-time block code being represented by a set of linear dispersion matrices in a linear dispersion representation, each linear dispersion matrix comprising components having complex values,
  generate at least some of the linear dispersion matrices depending on dispersion matrices, each pair comprising a first linear dispersion matrix and a second linear dispersion matrix, said component-wise conditions comprising a component-wise condition between the components of the first linear dispersion matrix and the components of the second linear dispersion matrix, said component-wise condition depending, for each column of the linear dispersion matrices, on at least one of the real dimensions of the product between a component of the first linear dispersion matrix and the complex conjugate of a component of the second linear dispersion matrix, and wherein said component-wise condition is satisfied if said at least one real dimension of said product is null, for each column of the linear dispersion matrices, and generate the encoded modulated digital data based on the generated space-time block code for transmission through a transmission channel to be received by a digital data receiver.

14. The device of claim 13, wherein the linear dispersion matrices are represented by matrix representations, in the basis of a given Algebra, said matrix elements corresponding to the elements of the integral basis of the number field used to construct the code.

15. The device of claim 13, wherein the transmission channel is represented by an equivalent channel matrix, the indexes of the two linear dispersion matrices of each pair of the linear dispersion matrices satisfying the component-wise condition corresponding respectively to the indexes of two columns of the equivalent channel matrix that are mutually orthogonal.

16. The device of claim 13, wherein the transmission channel is represented by an equivalent channel matrix, the equivalent channel matrix being associated with an upper triangular matrix according to a QR decomposition, and wherein the indexes of the two linear dispersion matrices of each pair of the linear dispersion matrices satisfying the component-wise condition correspond respectively to a position of the upper triangular matrix R associated with a zero value.

17. The device of claim 13, wherein the transmission channel is represented by an equivalent channel matrix, the equivalent channel matrix being associated with an upper triangular matrix according to a QR decomposition, and wherein the number of pairs of the linear dispersion matrices satisfying the component-wise condition corresponding corresponds to a number of positions of the upper triangular matrix R associated with a zero value.

18. An apparatus for encoding digital data, the apparatus comprising:
at least a memory, and
one or more processors configured to:
modulate the digital data received from an information source;
generate a space-time block code (STBC) for encoding the modulated digital data, wherein the space-time block code being represented by a set of linear dispersion matrices in a linear dispersion representation, each linear dispersion matrix comprising components having complex values;
generate at least some of the linear dispersion matrices depending on component-wise conditions related to a set of selected pairs of said linear dispersion matrices, each pair comprising a first linear dispersion matrix and a second linear dispersion matrix, said component-wise conditions comprising a component-wise condition between the components of the first linear dispersion matrix and the components of the second linear dispersion matrix, said component-wise condition depending, for each column of the linear dispersion matrices, on at least one of the real dimensions of the product between a component of the first linear dispersion matrix and the complex conjugate of a component of the second linear dispersion matrix, and wherein said component-wise condition is satisfied if said at least one real dimension of said product is null, for each column of the linear dispersion matrices; and generate the encoded modulated digital data based on the generated space-time block code for transmission through a transmission channel to be received by a digital data receiver.

19. An apparatus for decoding digital data, comprising:
a space-time block code (STBC) decoder configured to:
receive the encoded digital data from an encoder through a transmission channel;
decode the encoded digital data based on a space-time block code representing the encoded digital data, wherein the space-time block code comprising a set of linear dispersion matrices in a linear dispersion representation, each linear dispersion matrix comprising components having complex values, and at least some of the linear dispersion matrices are generated depending on component-wise conditions related to a set of selected pairs of said linear dispersion matrices, each pair comprising a first linear dispersion matrix and a second linear dispersion matrix, said component-wise conditions comprising a component-wise condition between the components of the first linear dispersion matrix and the components of the second linear dispersion matrix, said component-wise condition depending, for each column of the linear dispersion matrices, on at least one of the real dimensions of the product between a component of the first linear dispersion matrix and the complex conjugate of a component of the second linear dispersion matrix, and wherein said component-wise condition is satisfied if said at least one real dimension of said product is null, for each column of the linear dispersion matrices; and
a demodulator configured to demodulate decoded digital data to generate the demodulated decoded digital data.

20. A non-transitory computer storage medium comprising computing instructions which when executed by one or more processors, cause the one or more processors to
modulate digital data received from an information source;
generate a space-time block code (STBC) for encoding the modulated digital data, wherein the space-time block code being represented by a set of linear dispersion matrices in a linear dispersion representation, each linear dispersion matrix comprising components having complex values;
generate at least some of the linear dispersion matrices depending on component-wise conditions related to a set of selected pairs of said linear dispersion matrices, each pair comprising a first linear dispersion matrix and a second linear dispersion matrix, said component-wise conditions comprising a component-wise condition between the components of the first linear dispersion matrix and the components of the second linear dispersion matrix, said component-wise condition depending, for each column of the linear dispersion matrices, on at least one of the real dimensions of the product between a component of the first linear dispersion matrix and the complex conjugate of a component of the second linear dispersion matrix, and wherein said component-wise condition is satisfied if said at least one real dimension of said product is null, for each column of the linear dispersion matrices; and
generate the encoded modulated digital data based on the generated space-time block code for transmission through a transmission channel to be received by a digital data receiver.

* * * * *